United States Patent
Xu et al.

(10) Patent No.: US 11,217,534 B2
(45) Date of Patent: Jan. 4, 2022

(54) GALVANIC CORROSION PROTECTION FOR SEMICONDUCTOR PACKAGES

(71) Applicant: Intel Corporation, Santa Clara, CA (US)

(72) Inventors: Cheng Xu, Chandler, AZ (US); Junnan Zhao, Gilbert, AZ (US); Ji Yong Park, Chandler, AZ (US); Kyu Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/646,932

(22) PCT Filed: Dec. 30, 2017

(86) PCT No.: PCT/US2017/069136
§ 371 (c)(1),
(2) Date: Mar. 12, 2020

(87) PCT Pub. No.: WO2019/133006
PCT Pub. Date: Jul. 4, 2019

(65) Prior Publication Data
US 2020/0266149 A1    Aug. 20, 2020

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4857* (2013.01); *H01L 21/4864* (2013.01);
(Continued)

(58) Field of Classification Search
CPC . H01L 21/4857; H01L 21/4864; H01L 21/56; H01L 21/6835; H01L 23/145;
(Continued)

(56) References Cited

U.S. PATENT DOCUMENTS

2012/0003830 A1\* 1/2012 Lin ..................... H01L 24/06
438/637
2014/0045379 A1   2/2014 Chen
(Continued)

FOREIGN PATENT DOCUMENTS

WO   WO-2017-111957   6/2017

OTHER PUBLICATIONS

International Preliminary Report on Patentability for International Patent Application No. PCT/US2017/069136, dated Jul. 9, 2020, 6 pgs.

(Continued)

*Primary Examiner* — Amar Movva
(74) *Attorney, Agent, or Firm* — Schwabe, Williamson & Wyatt, P.C.

(57) ABSTRACT

Techniques of protecting cored or coreless semiconductor packages having materials formed from dissimilar metals from galvanic corrosion are described. An exemplary semiconductor package comprises one or more build-up layers; first and second semiconductor components (e.g., die, EMIB, etc.) on or embedded in the one or more build-up layers. The first semiconductor component may be electrically coupled to the second semiconductor component via a contact pad and an interconnect structure that are formed in the one or more build-up layers. The contact pad can comprise a contact region, a non-contact region, and a gap region that separates the contact region from the non-contact region. Coupling of the contact pad and an interconnect structure is performed by coupling only the contact region with the interconnect structure. Also, a surface area of the contact region can be designed to substantially equal to a surface area of the interconnect structure.

20 Claims, 25 Drawing Sheets

(51) Int. Cl.
*H01L 21/56* (2006.01)
*H01L 23/31* (2006.01)
*H01L 23/00* (2006.01)
*H01L 25/065* (2006.01)
*H01L 23/498* (2006.01)

(52) U.S. Cl.
CPC .......... *H01L 21/56* (2013.01); *H01L 23/3128* (2013.01); *H01L 23/5386* (2013.01); *H01L 24/16* (2013.01); *H01L 24/19* (2013.01); *H01L 24/24* (2013.01); *H01L 24/82* (2013.01); *H01L 25/0655* (2013.01); *H01L 23/49822* (2013.01); *H01L 23/49838* (2013.01); *H01L 2224/16225* (2013.01); *H01L 2924/19041* (2013.01); *H01L 2924/19102* (2013.01)

(58) Field of Classification Search
CPC .......... H01L 23/3128; H01L 23/49822; H01L 23/49838; H01L 23/49866; H01L 23/5381; H01L 23/5383; H01L 23/5386; H01L 24/16; H01L 24/19; H01L 24/24; H01L 24/27; H01L 24/29; H01L 24/32; H01L 24/48; H01L 24/81; H01L 24/82; H01L 25/0655; H01L 23/5221; H01L 2224/31–33183; H01L 2224/28–30183
See application file for complete search history.

(56) References Cited

U.S. PATENT DOCUMENTS

| | | | |
|---|---|---|---|
| 2014/0231985 A1* | 8/2014 | Liu | H01L 23/49838 257/737 |
| 2015/0245485 A1 | 8/2015 | Takahashi | |
| 2016/0005715 A1* | 1/2016 | Fazelpour | H01L 23/50 257/692 |
| 2017/0005054 A1* | 1/2017 | Chiu | H01L 23/528 |

OTHER PUBLICATIONS

International Search Report and Written Opinion for International Patent Application No. PCT/US2017/069136 dated Sep. 28, 2018, 9 pgs.

Partial European Search Report for European Patent Application No. 17935907.0, dated Jul. 16, 2021, 15 pgs.

European Search Report for 17935907.0, dated Sep. 20, 2021, 13 pgs.

* cited by examiner

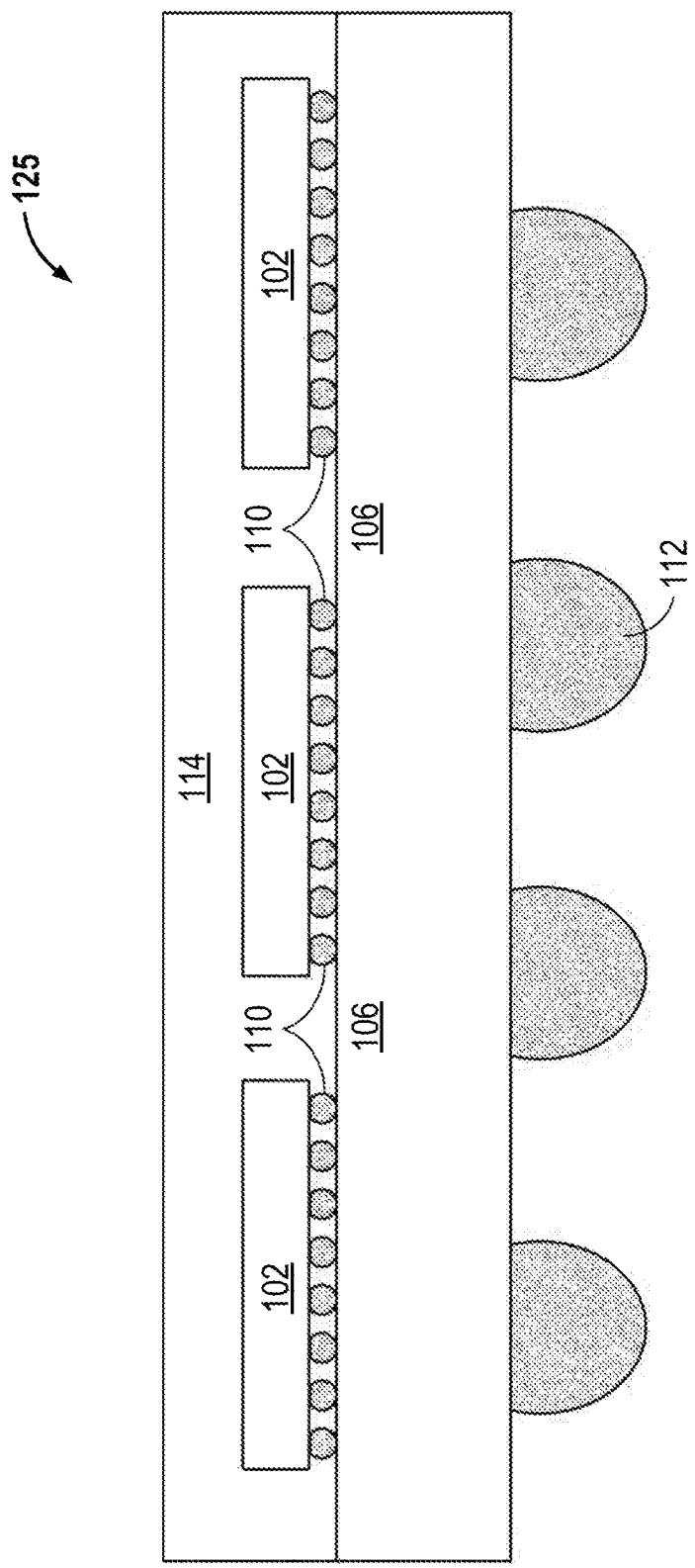

N-1 Layer Starting from ABF Lamination and Laser Opening

Desmear, Electroless Cu

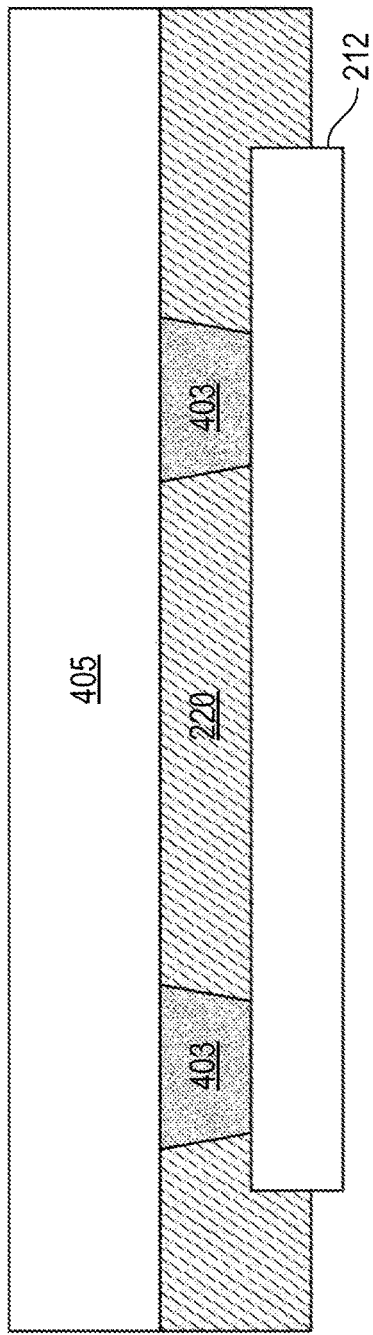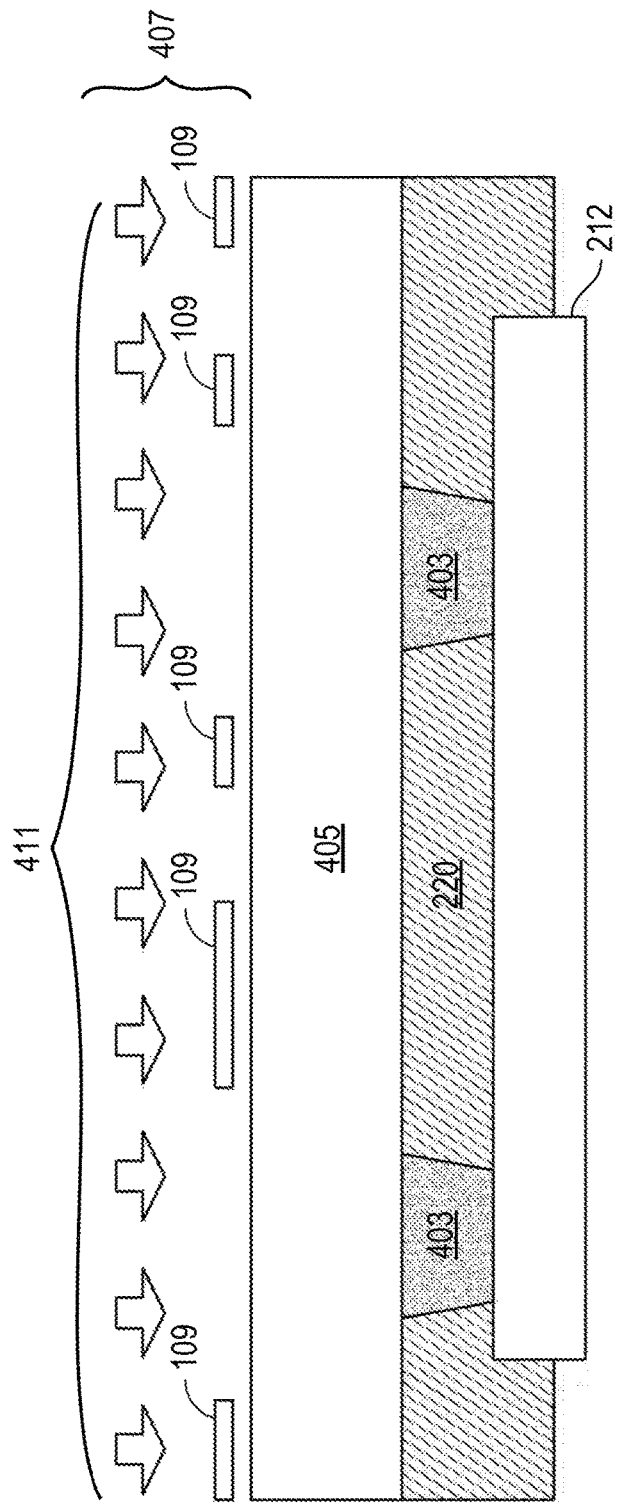

Electroless Cu Followed by Litho

DFR Strip with Flash Etch to Remove electroless Cu

GALVANIC CORROSION PROTECTION FOR SEMICONDUCTOR PACKAGES

CROSS-REFERENCE TO RELATED APPLICATION

This patent application is a U.S. National Phase Application under 35 U.S.C. § 371 of International Application No. PCT/US2017/069136, filed Dec. 30, 2017, entitled "GALVANIC CORROSION PROTECTION FOR SEMICONDUCTOR PACKAGES," which designates the United States of America, the entire disclosure of which is hereby incorporated by reference in its entirety and for all purposes.

FIELD

Embodiments generally relate to semiconductor packages. More specifically, embodiments relate to techniques of reducing or eliminating galvanic corrosion that may occur during formation of a semiconductor package.

BACKGROUND INFORMATION

At least one technique of forming a semiconductor package (e.g., packages with cores, packages without cores, packages with embedded components, packages without embedded components, etc.) may involve providing a permanent or temporary package core, and subsequently fabricating one or more build-up layers, dielectric materials, and electrical connections (e.g., vias, contact pads, traces, etc.) over the package core. During package formation, one or more semiconductor components (e.g., semiconductor die, wireless transceivers, bridge dies, etc.) can be assembled on or embedded within one or more layers (e.g., build-up layers, etc) and coupled or connected to each other using interconnect layers. The interconnect layers may include: (i) one or more metal vias; (ii) one or more metal lines (e.g., metal traces, contact pads, etc.); and (iii) one or more interconnect structures (e.g., bumps, pillars, etc.). For example, contact pads of a first semiconductor die can be coupled to contact pads associated with one or more components on a second semiconductor die (e.g., die-side capacitors (DSCs), host fabric interfaces (HFIs), etc.) using an interconnect structure (e.g., a conductive metal bump, a conductive metal pillar, etc.). For this example, the contact pad(s) of the first die, the contact pad(s) of the second component, and the interconnect structure may experience galvanic corrosion because at least two or more of the contact pad(s) of the first die, the contact pad(s) of the second component, and the interconnect structure may be made from dissimilar metals.

Galvanic corrosion is an electrochemical process in which one metal corrodes preferentially when it is in electrical contact with another, different metal in the presence of an electrolyte. Galvanic corrosion may cause electrical connections between the semiconductor components and/or electrical couplings to fail or become faulty. Galvanic corrosion can be caused by a chemical potential difference between a first semiconductor component or electrical coupling (e.g., a Cu pad covered with a NiPdAu finish, etc.) and a second semiconductor component or electrical coupling (e.g., a Cu bump, etc.). This chemical potential difference can result from differences in sizes of the surface areas of the first and second components or electrical couplings. Additionally, galvanic corrosion can occur when electrical couplings (e.g., interconnect structures, etc.) are missing or over-etched during an etching process used to remove a seed layer. Galvanic corrosion can also be created or exacerbated by use of a strong oxidizer (e.g., hydrogen peroxide, etc.) during package formation.

For a non-limiting example that involves embedded semiconductor components, package formation may include a build layer comprising a power plane, a cavity formed in the build-up layer(s) to expose the power plane, and a conductive adhesive disposed on top of the power plane. For this example, after deposition of the conductive adhesive, a bridge die may be placed within the cavity, and another build-up layer may be fabricated over the bridge die and the previously created build-up layers such that the bridge die is embedded within the build-up layers. After the bridge die is embedded, one or more semiconductor dies may be assembled over the build-up layers. The semiconductor dies may then be encapsulated in a molding compound to form a semiconductor package.

One type of bridge die is an embedded multi-die interconnect bridge (EMIB) developed by Intel Corporation. INTEL and EMIB may be trademarks of Intel Corporation. The bridge die may include: (i) a bulk portion that is in contact with the power plane via the conductive adhesive; and (ii) one or more interconnect layers fabricated on top of the bulk portion. The interconnect layers may include metal vias for connecting the power plane and the bridge die. Furthermore, the interconnect layers may also include one or more metal lines (e.g., metal traces, contact pads, etc.) that enable electrical couplings between the bridge die and the one or more semiconductor dies that are assembled over the build-up layers.

The electrical couplings between the bridge die and the semiconductor dies are achieved by coupling contacts contact pads of the bridge die with contact pads of the semiconductor dies. For example, contact pads of the bridge die can be electrically coupled to contact pads associated with one or more components on the semiconductor die (e.g., die-side capacitors (DSCs), host fabric interfaces (HFIs), etc.). Contact pads of the bridge die can be made of metal, such as copper (Cu), and covered with a surface finish, such as a Nickel-Palladium-Gold (NiPdAu) finish.

In at least one semiconductor package that includes a bridge die (e.g., an EMIB, etc.), contact pads of the bridge die may be electrically and mechanically coupled to contact pads of semiconductor dies via an interconnect structure. Examples of such interconnect structures include, but are not limited to, Cu bumps, any type of low-lead or lead-free solder bumps, tin-copper bumps, Cu pillars, micro bumps, and combinations thereof, or the like.

One problem that may occur during coupling of the contact pads of the bridge die to the contact pads of semiconductor dies via an interconnect structure is galvanic corrosion, which is explained above.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIG. 1B is a cross-sectional illustration of a semiconductor package that does not include embedded semiconductor components according one or more embodiments.

FIG. 2 may, but is not required to, be a more detailed version of FIG. 1A.

DETAILED DESCRIPTION

Figure 1A:
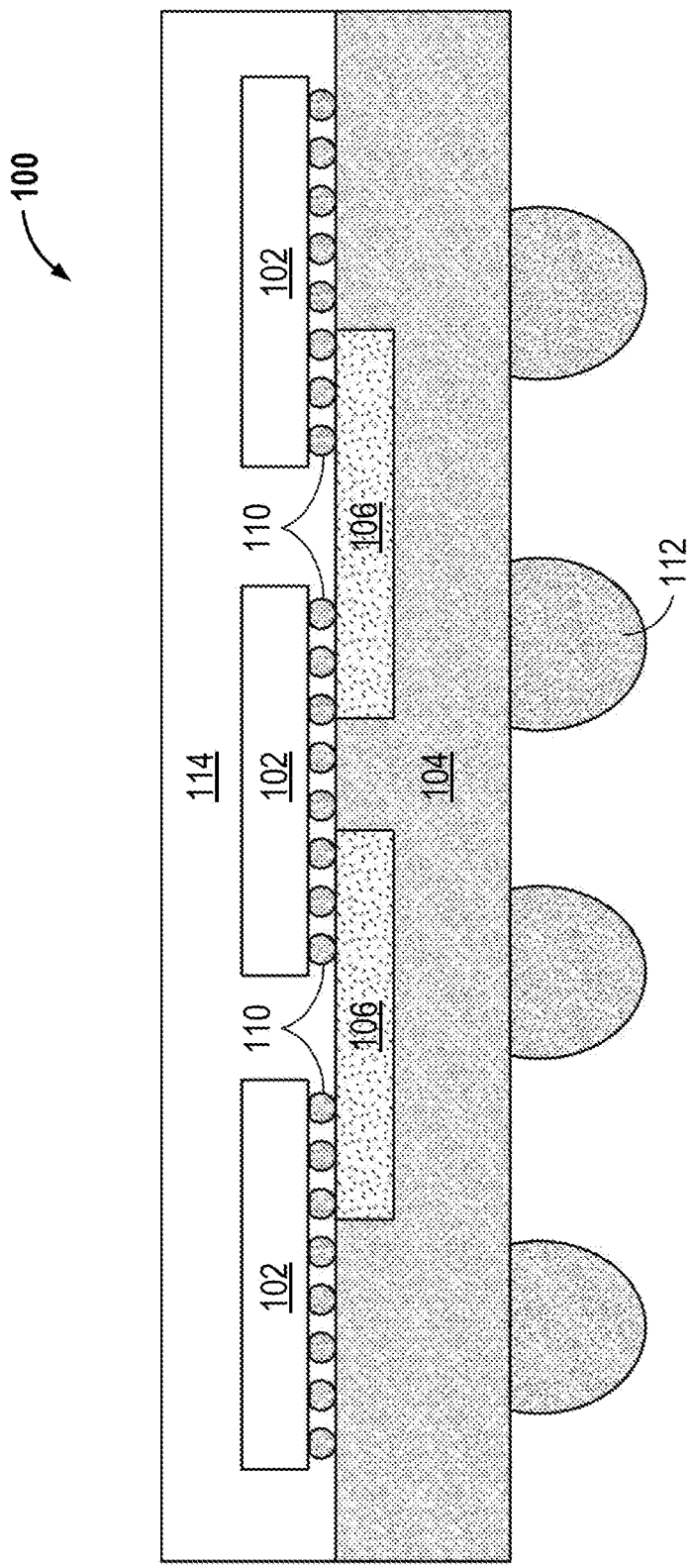
FIG. 1A is a cross-sectional illustration of a semiconductor package that includes an embedded multi-die interconnect bridge (EMIB) according one or more embodiments.

Embodiments described herein provide techniques that can assist with of reducing or eliminating galvanic corrosion that may occur during formation of a semiconductor package. One embodiment provides techniques that can assist with of reducing or eliminating galvanic corrosion that may occur during formation of a cored semiconductor package (i.e., a package having a core). Another embodiment provides techniques that can assist with of reducing or eliminating galvanic corrosion that may occur during formation of a coreless semiconductor package. Yet another embodiment provides techniques that can assist with reducing or eliminating galvanic corrosion that may occur during formation of a semiconductor package having an embedded semiconductor component (e.g., multi-die interconnect bridge (EMIB) that connects multiple dies, etc.). One more embodiment provides techniques that can assist with of reducing or eliminating galvanic corrosion that may occur during formation of a semiconductor package lacking an embedded semiconductor component.

As used herein, the term "semiconductor component" and its variations refer to discrete components used in semiconductor device fabrication and packaging. Examples include, but are not limited to, a semiconductor die, a bridge die, an interposer, an integrated heat sink/spreader, any other discrete component known in the art, etc.

In one embodiment, a semiconductor component (e.g., an EMIB, a semiconductor die, etc.) comprises a contact pad, where the contact pad has a contact region within the contact pad and where a surface area of the contact region is smaller than or equal to a surface area of the contact pad. In a specific embodiment, the contact region and the contact pad are separated by a gap region (that may be filled with a dielectric material). In one embodiment, any connections between the contact pad and an interconnect structure (e.g., a bump, a pillar, etc.) are performed by connecting the contact region to the interconnect structure. Furthermore, and in one embodiment, no other part of the contact pad (except the contact region) is connected to the interconnect structure. For clarity, any part of the embodiments of a contact pad described herein that is not the contact region or the gap region is a non-contact region. In some scenarios, two or more of the contact pad, the interconnect structure, and the connections are formed from dissimilar metals. Examples of such metals include, but are not limited to, copper (Cu), tin (Sn), nickel (Ni), Palladium (Pd), Gold (Au), any metal or metal alloy that may be used to form an interconnect structure as is known in the art of semiconductor manufacturing (e.g., electrolytic plating, etc.), and any combination thereof.

In the embodiments described above, a surface area of the contact pad can have any size, while a size of the contact region's surface area can be controlled to comply with one or more parameters that can assist with reducing or eliminating the likelihood of galvanic corrosion during package formation. One such parameter is a surface area of an interconnect structure (e.g., a bump, a pillar, etc.). For example, and for one embodiment, a size of a surface area of the contact region of a contact pad of a first semiconductor component (e.g., an EMIB, a semiconductor die, etc.) can be designed to be substantially equal to a size of a surface area of an interconnect structure (e.g., bump, pillar, etc.) used to couple the first semiconductor component to a second semiconductor component (e.g., a semiconductor die, etc.). This scheme of connecting only the contact region of the contact pad to an interconnect structure can assist with reducing or eliminating a rate of galvanic corrosion.

In short, electrically coupling interconnect structures to a contact region of a contact pad of a semiconductor component (where the contact region is separated from the rest of the semiconductor component's contact pad by a gap region) can assist with reducing or eliminating the occurrence of galvanic corrosion during package formation. It logically follows, therefore, that the embodiments described herein may allow for cost reductions associated with forming semiconductor packages.

FIG. 1A illustrates a cross-sectional side view of a semiconductor package 100 according one or more embodiments. As shown, the package 100 includes two EMIBs 106 and 108, in accordance with one embodiment. The package 100 may include a package substrate 104 having a plurality (i.e., two or more) of dies 102 mounted on the package substrate 104. The dies 102 can be attached to the package substrate 104 according to a variety of suitable configurations including, a flip-chip configuration, as depicted, or other configurations such as wire bonding and the like. In the flip-chip configuration, an active side of the dies 102 is attached to a surface of the package substrate 104 using interconnect structures 110 such as bumps or pillars. Examples of such interconnect structures include, but are not limited to, Cu bumps, any type of low-lead or lead-free solder bumps, tin-copper bumps, Cu pillars, combinations thereof, or the like. The active side of the dies 102 may have one or more transistor devices formed thereon. Each of the dies 102 may represent a discrete chip. The dies 102 may be, include, or be a part of a processor, memory, or application specific integrated circuit (ASIC) in one embodiment.

The interconnect structures 110 may be configured to route electrical signals between the dies 102 and the package substrate 104. In one embodiment, the interconnect structures 110 may be configured to route electrical signals such as, for example, input/output (I/O) signals and/or power or ground signals associated with the operation of the dies 102.

The package substrate 104 may include electrical routing features configured to route electrical signals to or from the dies 102. The electrical routing features may be internal and/or external to one or more of the EMIB 106 and the EMIB 108. For example, in one embodiment, each of the package substrate 104, the EMIB 106, and the EMIB 108 includes electrical routing features such as contact pads (not shown) and/or traces (not shown) configured to receive the interconnect structures 110 and route electrical signals to or from the dies 102.

Package level interconnect structures 112 such as, for example, solder balls, may be coupled to a surface of the package substrate 104 to further route the electrical signals to other electrical devices (e.g., motherboard or other chipset). In one embodiment, the package substrate 104 is an epoxy-based laminate substrate having one or more of a core and at least one build-up layer such as, for example, an Ajinomoto Build-up Film (ABF) substrate. The package substrate 104 may include other suitable types of substrates in other embodiments.

In one embodiment, the dies 102 are electrically coupled with one or more of the EMIB 106 and the EMIB 108, where each of the EMIBs 106 and 108 is configured to route electrical signals between the dies 102. Each of the EMIB 106 and the EMIB 108 may be a dense interconnect structure that provides a route for electrical signals. Each of the EMIB 106 and the EMIB 108 may include a bridge substrate composed of glass or a semiconductor material (e.g., high resistivity silicon) having electrical routing features formed thereon to provide a chip-to-chip connection between the dies 102. Each of the EMIB 106 and the EMIB 108 may be composed of other suitable materials in other embodiments.

As shown in FIG. 1A, and in one embodiment, each of the EMIB 106 and the EMIB 108 may be embedded in a cavity of the package substrate 104. For example, in one embodiment, the EMIB 106 may include a gap to serve as a dielectric material between electrical routing features of the EMIB 106. The immediately preceding example is also applicable to the EMIB 108. In one embodiment, a portion of the dies 102 may overly the EMIB 106 and/or the EMIB 108, as shown in FIG. 1A.

Although three dies 102 and two EMIBs 106 and 108 are depicted in FIG. 1A, other embodiments may include more or fewer dies and EMIBs connected together in other possible configurations including three-dimensional configurations. For example, another die that is disposed on the package substrate 104 in or out of the page relative to the dies 102 of FIG. 1 may be coupled to the dies 102 using another bridge die, which may or may not be an EMIB.

Furthermore, and as shown in FIG. 1A, the dies 102 and interconnect structures 110 are encapsulated in a molding material 114. Molding materials are described in further detail below in connection with FIG. 2.

FIG. 1B is a cross-sectional illustration of a semiconductor package 125 that does not include embedded semiconductor components according one or more embodiments. Components 102, 110, 112, and 114 are described above in connection with FIG. 1A, so they are note described again from brevity.

One difference between the package 100 of FIG. 1A and the package 125 of FIG. 1B is that the presence of the substrate 199 in FIG. 1B. As shown, the package substrate 199 lacks any embedded semiconductor devices, such as an EMIB, etc. The package substrate 199 may include electrical routing features configured to route electrical signals to or from the dies 102. For example, in one embodiment, the package substrate 199 includes electrical routing features such as contact pads (not shown) and/or traces (not shown) configured to receive the interconnect structures 110 and route electrical signals to or from the dies 102.

Figure 1C:
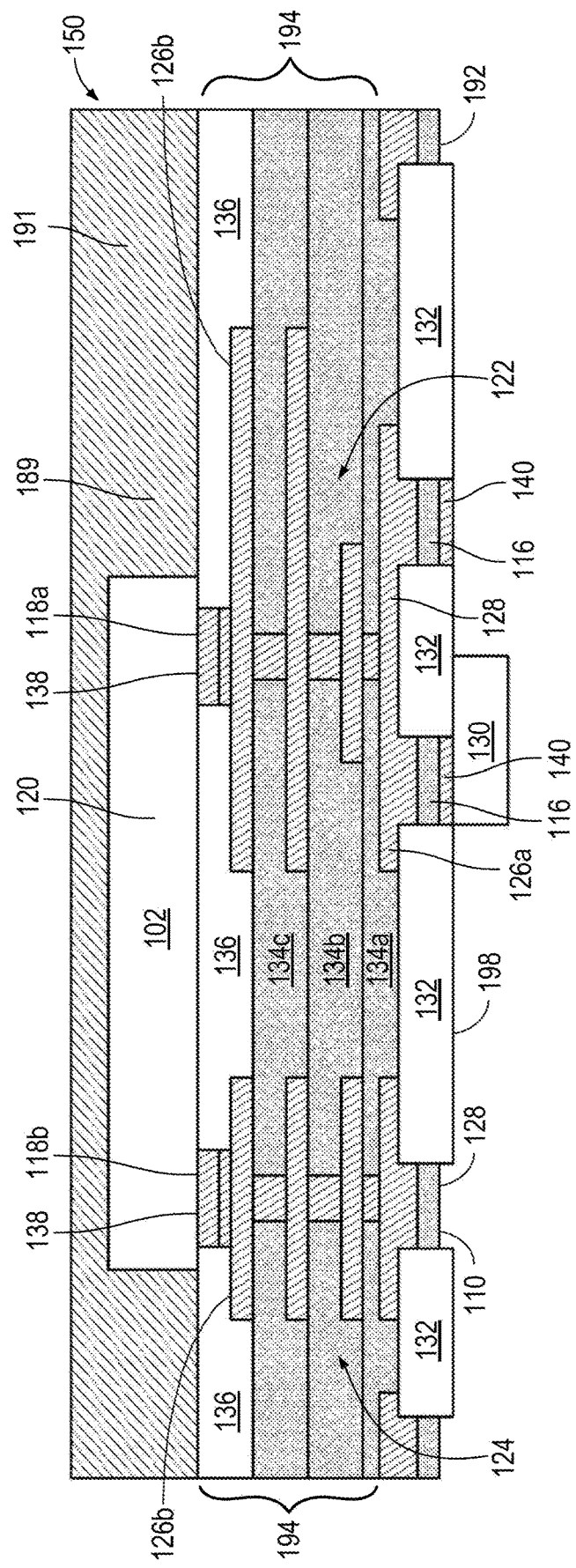
FIG. 1C is a cross-sectional illustration of a coreless semiconductor package according one or more embodiments.

FIG. 1C is a cross-sectional illustration of a coreless semiconductor package 150 according one or more embodiments. As shown, the package 150 including a die 102 and a coreless substrate 196. The coreless substrate 196 may include a first side 198 and a second side 189 opposite to the first side 198 of coreless substrate 196. Two or more device contact pads 116 may be disposed on the first side 198. One or more electrical routing features 192 may also be disposed on the first side 198 of coreless substrate 196. In one embodiment, electrical routing features 192 may include a ball grid array (BGA) or other electrical components that may route electrical signals between primary logic die 102 and other components (e.g., a circuit board, etc.) to which the package 100 is attached. Other electrical routing features 118A-B may be disposed on the second side 189 of coreless substrate 196. In one embodiment, electrical routing features 118A-B may include or be one or more die bond contact pads. In one embodiment, electrical routing features 118A-B may be coupled to active side 120 of primary logic die 102 by interconnect structures 138. In some embodiments, interconnect structures 138 may include solderable material or another conductive material. In one embodiment, electrical routing features 192, electrical routing features 118A-B, and/or device contact pads 116 may include one or more layers of copper, gold, palladium, and/or nickel, in any combination. In other embodiments, electrical routing features 118A-B may include electroless nickel immersion gold (ENIG) or ENIG and electroless gold (ENIG EG). In still other embodiments, electrical routing features 118A-B may include one or more of electroless Nickel, electroless Palladium and Immersion gold (ENEPIG), immersion Tin (ImSn), direct immersion gold (DIG), organic preservative solderability (OSP), and electroless Palladium immersion gold (EPIG).

In one embodiment, coreless substrate 196 may have a first outer layer 132 disposed on the first side 198 and a second outer layer 136 disposed on the opposite second side 189. Electrical routing features 192 and device contact pads 116 may be disposed within openings in first outer layer 132. Electrical routing features 118A-B may be disposed within openings in second outer layer 136. In some embodiments, each of first outer layer 132 and second outer layer 136 may be, or may include, a solder resist layer.

The package 100 may include a plurality of build-up layers 194. For example, the plurality of build-up layers 194 may include one or more build-up layers 134A-C disposed between the first outer layer 132 and the second outer layer 136. Build-up layers 134A-C may include dielectric layers formed with, for example, an ABF substrate. While FIG. 1C illustrates three build-up layers 134A (first build-up layer), 134B (second build-up layer), and 134C (outermost build-up layer), other embodiments may have less or more than four build-up layers. The plurality of build-up layers 194 may include a plurality of conductive elements 126A-B and connectors 128. Conductive elements 126A-B may be formed as traces or other structures on or between build-up layers. Connectors 128 may be conductive features such as metal-filled or plated vias that interconnect the conductive elements 126A-B to form the first and second electrical paths 122/124. In one embodiment, conductive elements 126A-B and/or connectors 128 may include copper or another metal or metal alloy.

In one embodiment, a first electrical path 122 may include at least one conductive element 126A that is disposed on or between two of the plurality of build-up layers 194. Contact pads 116 may be coupled with conductive element 126A. Other conductive elements are indicated as 126B. Although vias in the drawings are shown as having uniformly straight sides, vias may have other shapes as well. For example, vias drilled by lasers may tend to have tapered shapes, e.g., with one end being larger than the opposite end.

In one embodiment, the first electrical path 122 may be formed in plurality of build-up layers 194 between contact pads 116 on first side 198 and a first electrical routing feature 118A on second side 114. A second electrical path 124 may be formed in plurality of build-up layers 194 between electrical routing feature 192 on first side 198 and another of the electrical routing features 118b on second side 114. Thus, first electrical path 122 may route electrical signals between active surface 120 of primary logic die 102 and a capacitor, such as capacitor 130, and second electrical path 124 may route electrical signals between active surface 120 of primary logic die 102 and other components, such as a circuit board. In some embodiments, the electrical signals may include, for example, input/output (I/O) signals and/or power or ground signals associated with the operation of the die 102. In one embodiment, first electrical path 122 and second electrical path 124 may not include solder, as they may be fabricated with other suitable components using a bumpless build up layer (BBUL) process.

Figure 2:
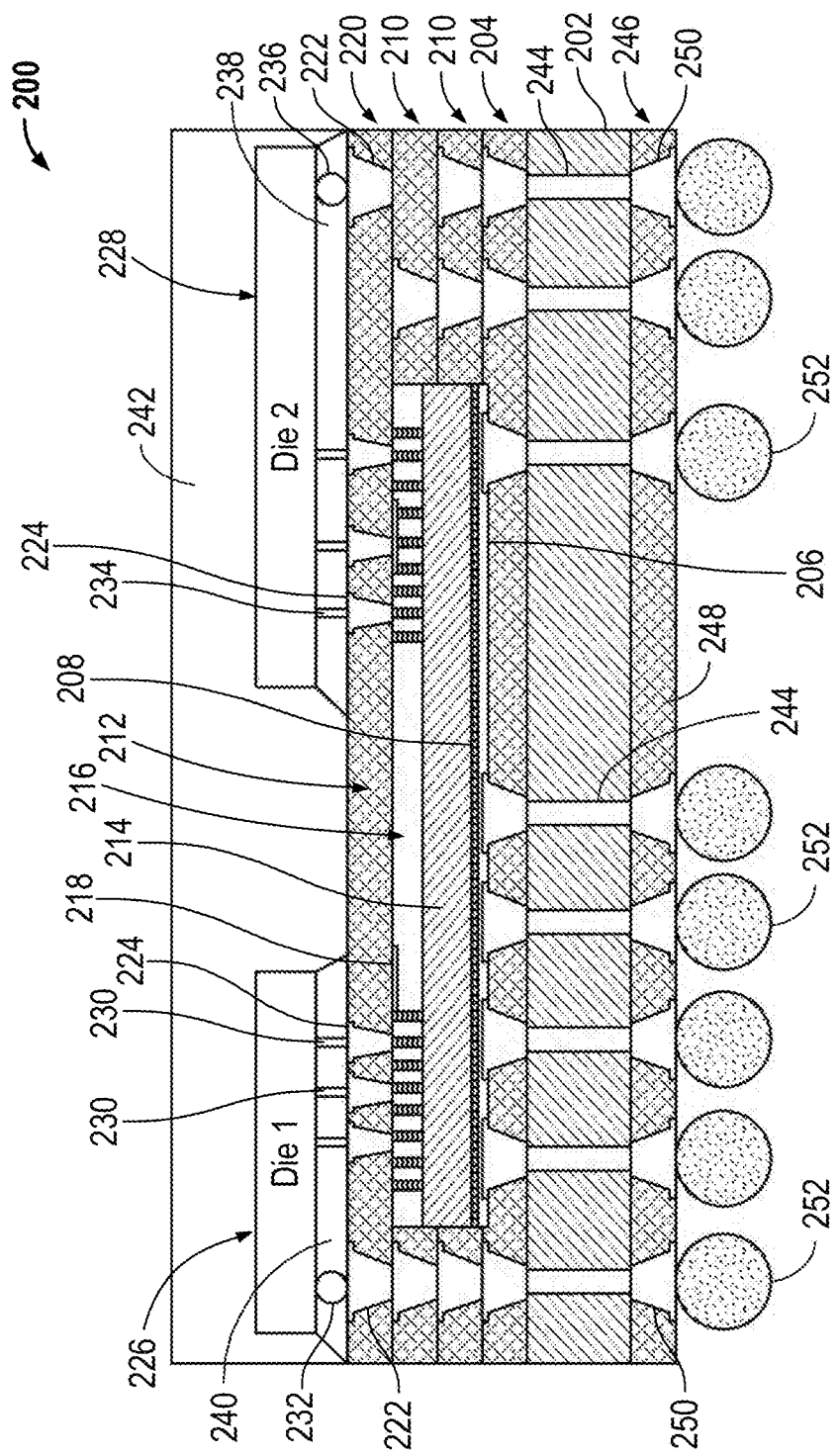
FIG. 2 is cross-sectional illustration of a semiconductor package having an EMIB in accordance with one embodiment.

FIG. 2 is cross-sectional illustration of a semiconductor package 200 having an EMIB 212 that connects multiple dies 226 and 228 in accordance with one embodiment. FIG. 2 may be viewed as, but is not required to be viewed as, a more detailed version of FIG. 1A.

As shown in FIG. 2, the package 200 includes a package core 202 with at least one build-up layer 204 provided over the core 202. The package core 202 may include a power plane contact 206. Although a single build-up layer 204 between the core 202 and the EMIB 212 is shown here, there may be any number of build-up layers between the core 202 and the EMIB 212. There may also be any number of build-up layer(s) 210 over the power plane build-up layer 204. After fabricating the build-up layer(s) 210, a cavity overlying the power plane contact 206 in the power plane build-up layer 204 may be formed within the build-up layers 210 to accommodate the EMIB 212. In one embodiment, the EMIB 212 may be disposed within the cavity and over at least a portion of the power plane contact 206. A layer of conductive adhesive 208 may be provided between the power plane contact 206 and the backside of a bulk portion 214 of the EMIB 212.

In one embodiment, a thickness of the EMIB 212 may be such that it is approximately the thickness of an integer number of the build-up layers 204 and/or 210. This may be so that subsequent to embedding the EMIB 212 in the cavity formed in build-up layers 210, the processing surface remains relatively planar. The planarity of the surface at these intermittent fabrication points may provide a relatively more robust fabrication process and resulting semiconductor package 200. For example, providing a relatively flat intermittent surface may result in relatively improved adhesion of subsequent layers that may overlie the EMIB 212 and the build-up layer 210 surface.

One or more overlying build-up layer(s) 220 may be formed on top of the EMIB 212. The overlying build-up layer 220 may have metal contacts 222 and 224 that may line up and contact metal traces and/or vias 218 formed in one or more back-end-of-line (BEOL) interconnect layers 216 of the EMIB 212. If the overlying build-up layer 220 is also the topmost build-up layer, as depicted here, then the dies 226 and 228 may be assembled thereon. In other embodiments, the build-up layer 220 overlying the EMIB 212 may not be the topmost build-up layer. In these cases, there may be one or more build-up layers over the build-up layer overlying and contacting the EMIB 212, and the dies 226 and 228 may be assembled on those one or more build-up layers.

The dies 226 and 228 may be assembled on the build-up layer 220 using interconnect structures 230, 232, 234 and 236 of various types and/or dimensions. In one embodiment, the interconnect structures 230 and 234 that may be overlying or in relative proximity to the EMIB 212 may be of tighter (e.g., smaller size, reduced pitch, and/or higher spatial density, etc.) than the interconnect structures 232, 236 that may not be overlying the EMIB 212 and/or not in relative proximity of the EMIB 212. In one embodiment, the interconnect structures 230, 232, 234, 236 may be connected to one or more power delivery metal contacts 224 of the build-up layer 220, that may be connected to power delivery metal traces and/or vias 218 of the interconnect layer(s) 216 of the EMIB 212, which may in turn be connected to the bulk of the EMIB 212, and which may in turn be further connected to the power plane contact 206 of the build-up layer 204. Thus, by the aforementioned pathway, power may be delivered to one or more of the dies 226 and 228 through the bulk portion 214 of the EMIB 212, according to one embodiment.

The first die 226 and the second die 228 may be electrically and mechanically attached to the package build-up layer 220 by any suitable mechanism including, but not limited to, any type of interconnect structure. Examples of such structures include, but are not limited to, metal pillars (e.g., Cu pillars), flip chip bumps, solder bumps, any type of low-lead or lead-free solder bumps, tin-copper bumps, wire bonds, wedge bonds, C4, ACF, NCF, combinations thereof, or the like. Pick-and-place tools and processes may be used, for example, to align and attach dies 226 and 228 onto the package. For one example, Cu pillars may be used for die attachment. The Cu pillars may be of any suitable size. For example, the Cu pillars may be approximately in the range of about 10 µm to about 150 µm in width. The dies 226 and 228 may be aligned and attached to the semiconductor substrate by any suitable mechanisms. For example, a thermosonic process may be used to fuse the Cu pillars to corresponding contact pads 224 on the build-up layer 220 using gold/nickel, tin/lead, or any suitable metallurgy. As another example embodiment, a wave soldering process may be used to attach the dies 226 and 228 to the package build-up layer 220.

In one embodiment, underfill material 238 and 240 may be provided around the die-to-package contacts 230, 232, 234 and 236 between the dies 226 and 228 and the build-up layer 220. Representative epoxy materials in the underfill material 238 and 240 may include an amine epoxy, imidizole epoxy, a phenolic epoxy or an anhydride epoxy. Other examples of underfill material include polyimide, benzocyclobutene (BCB), a bismaleimide type underfill, a polybenzoxazine (PBO) underfill, or a polynorbomene underfill. Additionally, the underfill material 238 and 240 may include a filler material, such as silica. Underfill material 238 and 240 may be introduced by spin coating, extrusion coating, or spray coating techniques. In another embodiment, the underfill material 238 and 240 includes a standard fabrication passivation material such as an inorganic passivation material (e.g., silicon nitride, silicon oxynitride) or organic passivation material (e.g., polyimide).

Referring again to FIG. 2, a molding material 242 may be disposed on the top surface of the build-up layer 220 and used for encapsulating the dies 226 and 228. The molding material may be any suitable molding material or compound. For example, the molding material may be a liquid dispensed thermosetting epoxy resin molding compound. For this example, the molding material 242 may be deposited on the surface of the build-up layer 220 using any suitable mechanism including, but not limited to, liquid dispense, spin coating, spray coating, squeegee, screen printing, combinations thereof, or the like. The molding material 242, after being dispensed onto the top surface of the build-up layer 220, may be cured while pressure is applied thereon by a chase surface. For a further example, a chase (e.g., a relatively flat surface pressed on top of the liquid molding material 242 disposed on top of the build-up layer 220) may itself be heated. Upon curing (e.g., cross-linking), the deposited molding material 242 may harden and adhere to the build-up layer 220. In this way, the dies 226 and 228 are encapsulated by the molding material 242. The molding material 242 may have fillers and/or other materials therein to preferentially control the coefficient of thermal expansion (CTE), reduce stresses, impart flame retardant properties, promote adhesion, and/or reduce moisture uptake in the molding material 242. The molding material 242 may also be any suitable thickness.

For one embodiment, the semiconductor package 200 having the EMIB 212 may have through-hole vias 244 formed in the package core 202. These through-hole vias 244 may provide electrical connectivity of the dies 226 and 228 to one or more bottom build-up layer(s) 246. Like topside build-up layers 204 and 210, the bottom build-up layer(s) 246 may also include dielectric material 248, such as dielectric laminate material, and metal contacts 250. Although a single build-up layer 246 is shown on the bottom side of the semiconductor package 200, there may be any number of build-up layers 246 on the bottom side of the semiconductor package 200. For example, there may be an equal number of build-up layers on the bottom side as there are on the top surface of the semiconductor package 200. The processes for forming build-up layers may be amenable to forming build-up layers on both sides of the core 202 nearly simultaneously and in a relatively cost-effective manner. For example, dielectric material for a build-up layer may be laminated on both sides of the core 202 concurrently.

Referring again to FIG. 2, a plurality of contacts 252 for package level I/O may be provided on the bottom side build-up layer(s) 246. The contacts 252 may be any suitable contacts for semiconductor package-to-board interconnections, such as ball grid array (BGA) or other area array contacts.

Figure 3:
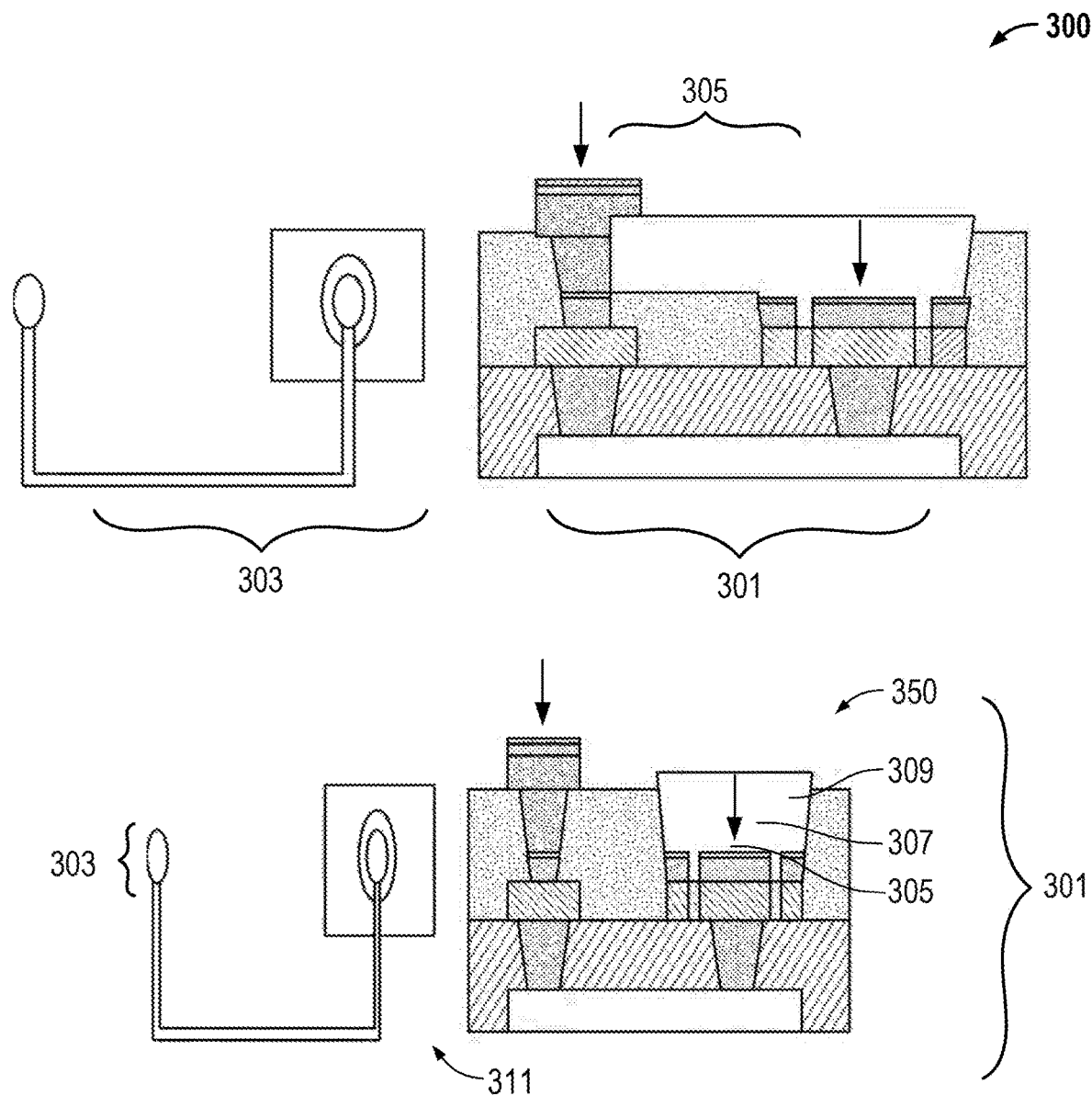
FIG. 3 depicts a plan view and cross-sectional illustrations of a portion that may exists in one or more of the semiconductor packages shown in FIGS. 1A-2 according to one embodiment.

FIG. 3 depicts a cross-sectional view illustration 300 and a plan view illustration 350 of a portion of the semiconductor package. According to one embodiment, the portion shown in FIG. 3 may exist in one or more of the semiconductor packages described above in connection with at least one of FIGS. 1A-2. The semiconductor package can be a cored semiconductor package (that may or may not comprise one or more embedded components) or a coreless package (that may or may not comprise one or more embedded components). As shown in views 300 and 350, the illustrated portion of the semiconductor package can be conceptually divided into a contact pad 301 and an interconnect structure 303. In one embodiment, the contact pad 301 can be the same as or similar to any of the contact pads of a semiconductor component described above in connection with FIGS. 1A-2 (e.g., the contact pad 224, etc.). In one embodiment, the interconnect structure 303 can be the same as or similar to the interconnect structures used to connect a die to a contact pad of a semiconductor component (e.g., the structure 230, etc.). The interconnect structure 303 can be a pillar or bump (e.g., a pillar, a bump, etc.). For one embodiment, and as shown in FIG. 3, the contact pad 301 includes a contact region 305, a gap region 307, and a non-contact region 309. The contact region 305 is separated from the non-contact region 309 by the gap region 307 (which may be filled with a dielectric material). In one embodiment, a surface area of the contact region 305 is not larger than a surface area of the entire contact pad 301. In a specific embodiment, a surface area of the contact region 305 is smaller than a surface area of the entire contact pad 301. In one embodiment, any connection between the contact pad 301 and the interconnect structure 303 is achieved by electrically coupling the contact region 305 to the interconnect structure 303 via an electrical communications pathway 311. Furthermore, and in one embodiment, the non-contact region 309 is not electrically coupled to the interconnect structure 303 via any electrical communications pathway (including pathway 311). In this way, no other part of the contact pad 301 (except the contact region 305) is electrically coupled to the interconnect structure 303.

In the embodiments described above, a surface area of the contact pad 301 can have any size, while a size of the contact region 305's surface area can be controlled to comply with one or more parameters that can assist with reducing or eliminating the likelihood of galvanic corrosion during package formation. One such parameter is a surface area of the interconnect structure 303 (e.g., a bump, a pillar, etc.). For example, and for one embodiment, a size of a surface area of the contact region 305 can be designed to be substantially equal to a size of a surface area of the interconnect structure 303 used to couple a first semiconductor component (e.g., an EMIB, a die, etc.) to a second semiconductor component (e.g., an EMIB, a die, etc.). In this way, the embodiments described above may assist with reduction or elimination of a rate of galvanic corrosion.

Figure 4A:
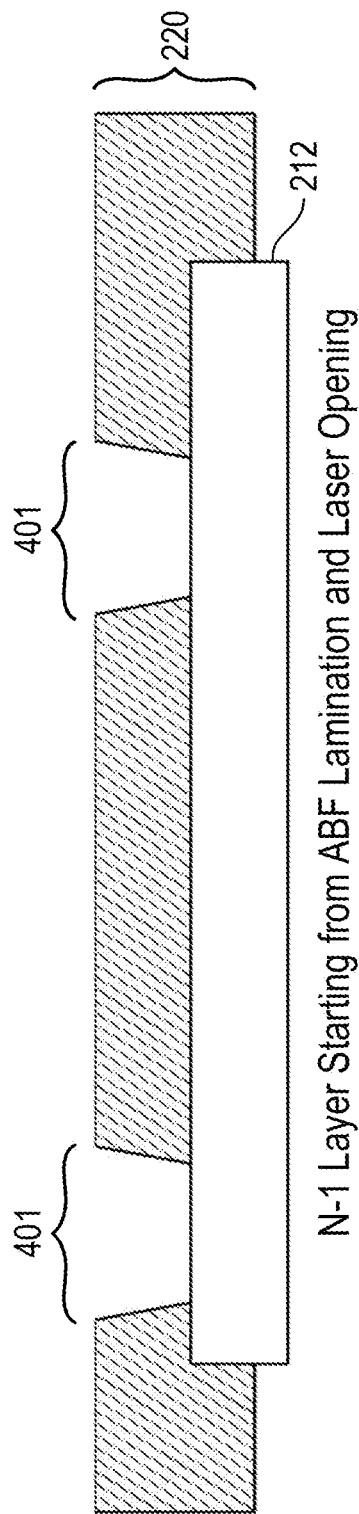
FIGS. 4A-4N are cross-sectional side view illustrations of a method of forming the portion shown in FIG. 3 according to one embodiment.
Figure 4B:
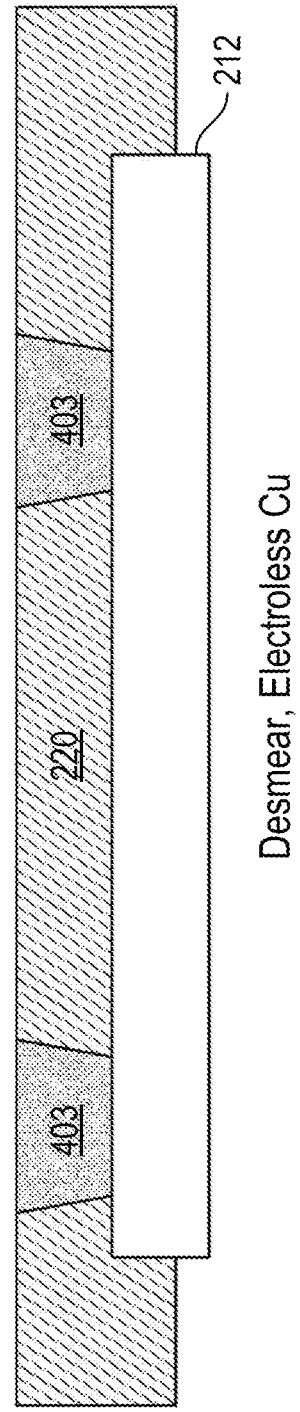
Figure 4E:
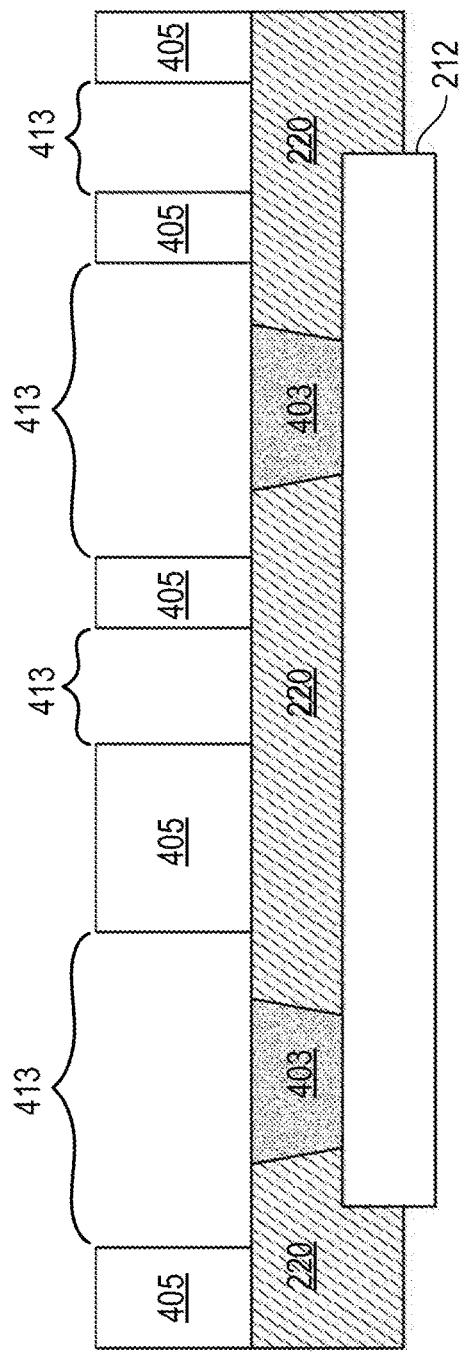
Figure 4F:
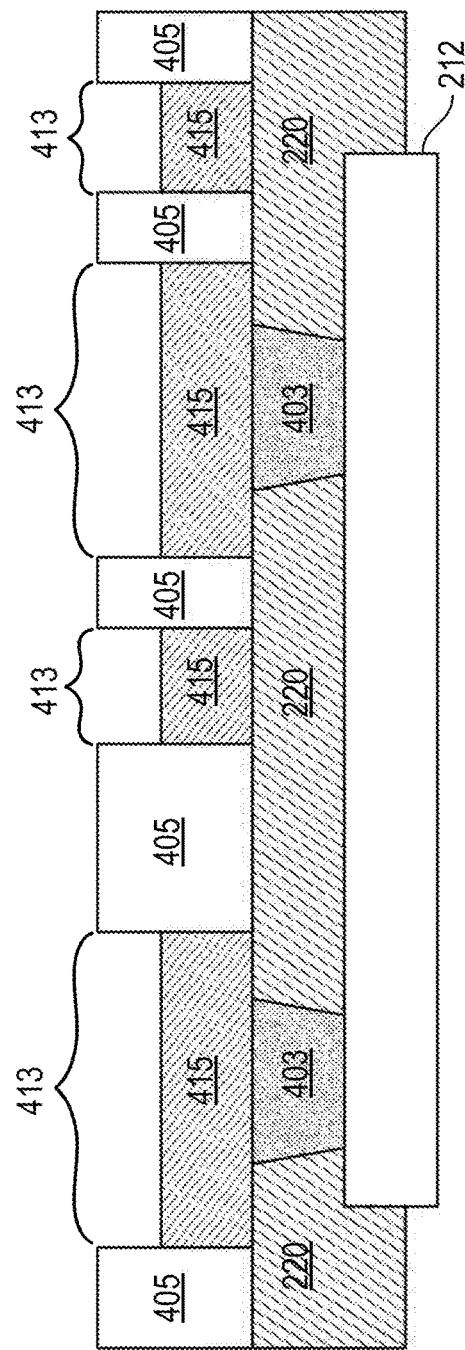
Figure 4G:
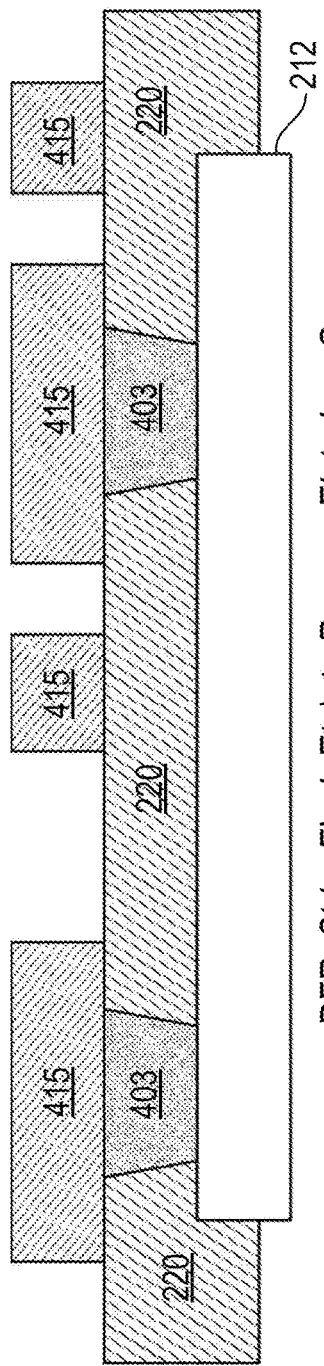
Figure 4H:
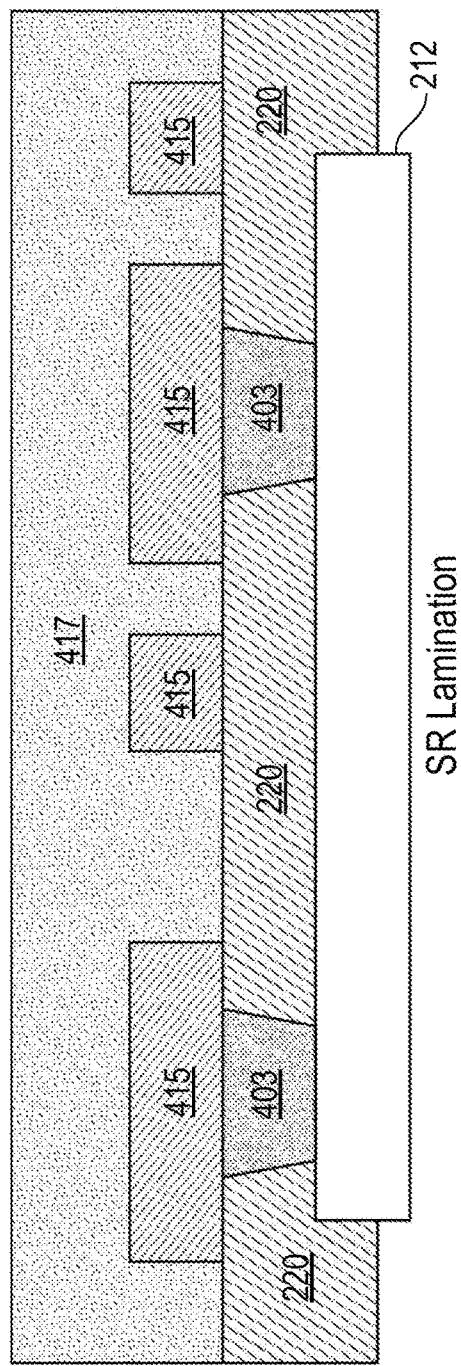
Figure 4I:
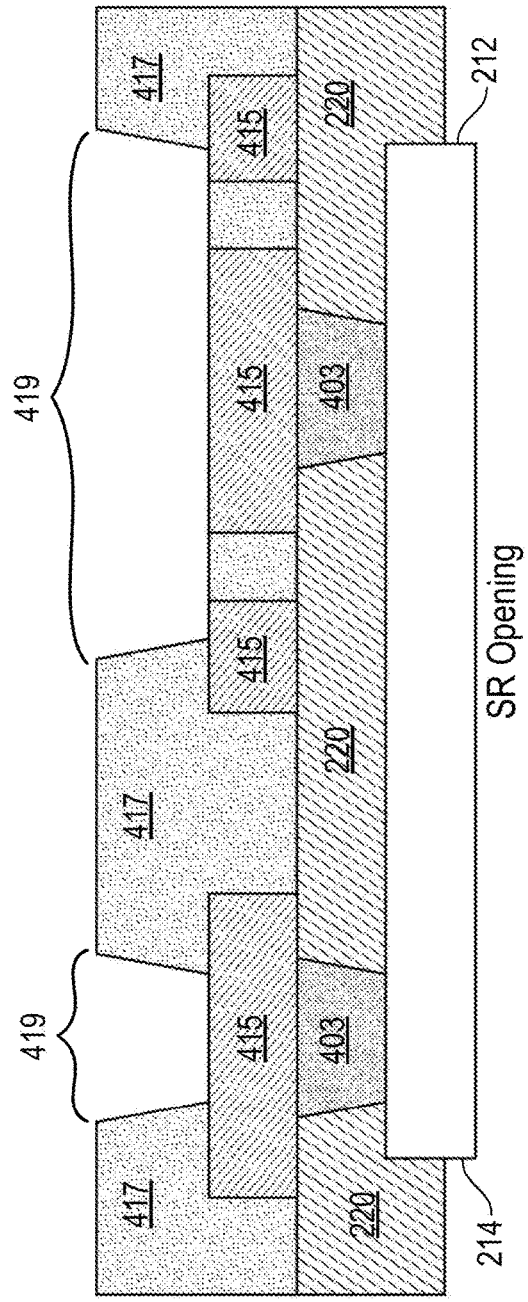
Figure 4J:
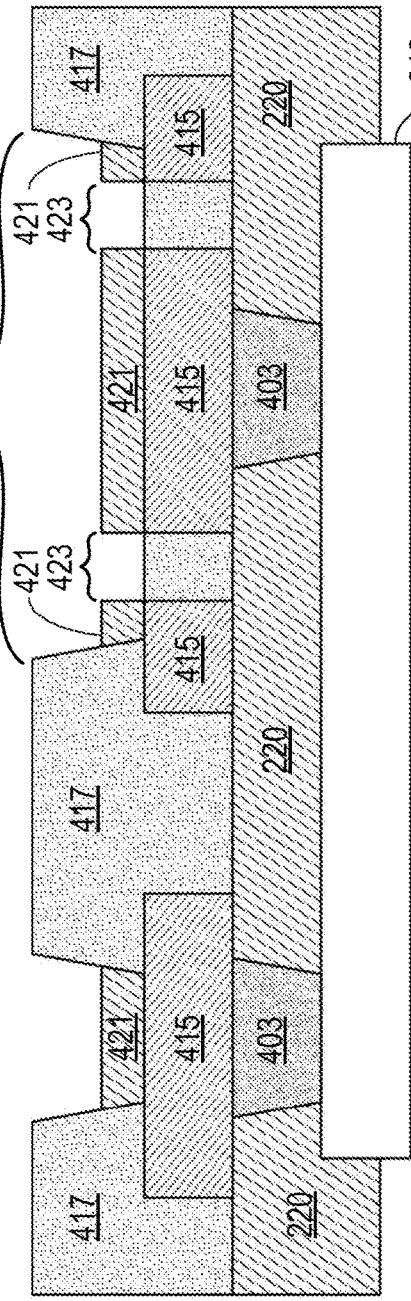
Figure 4K:
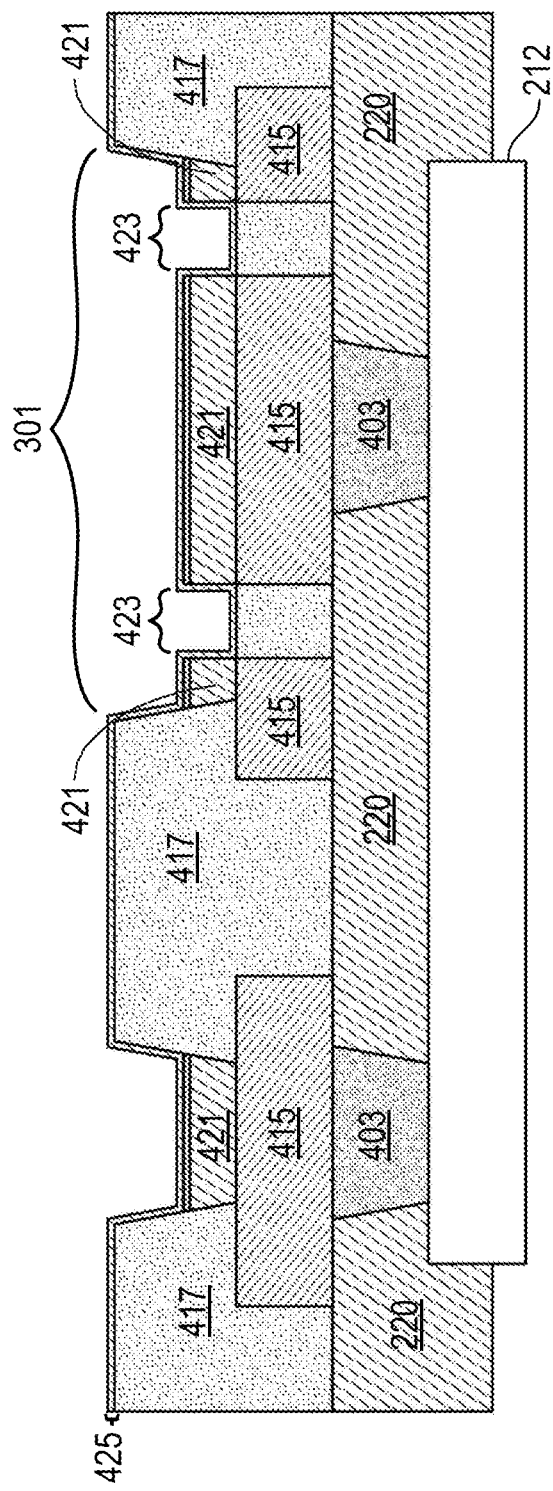
Figure 4L:
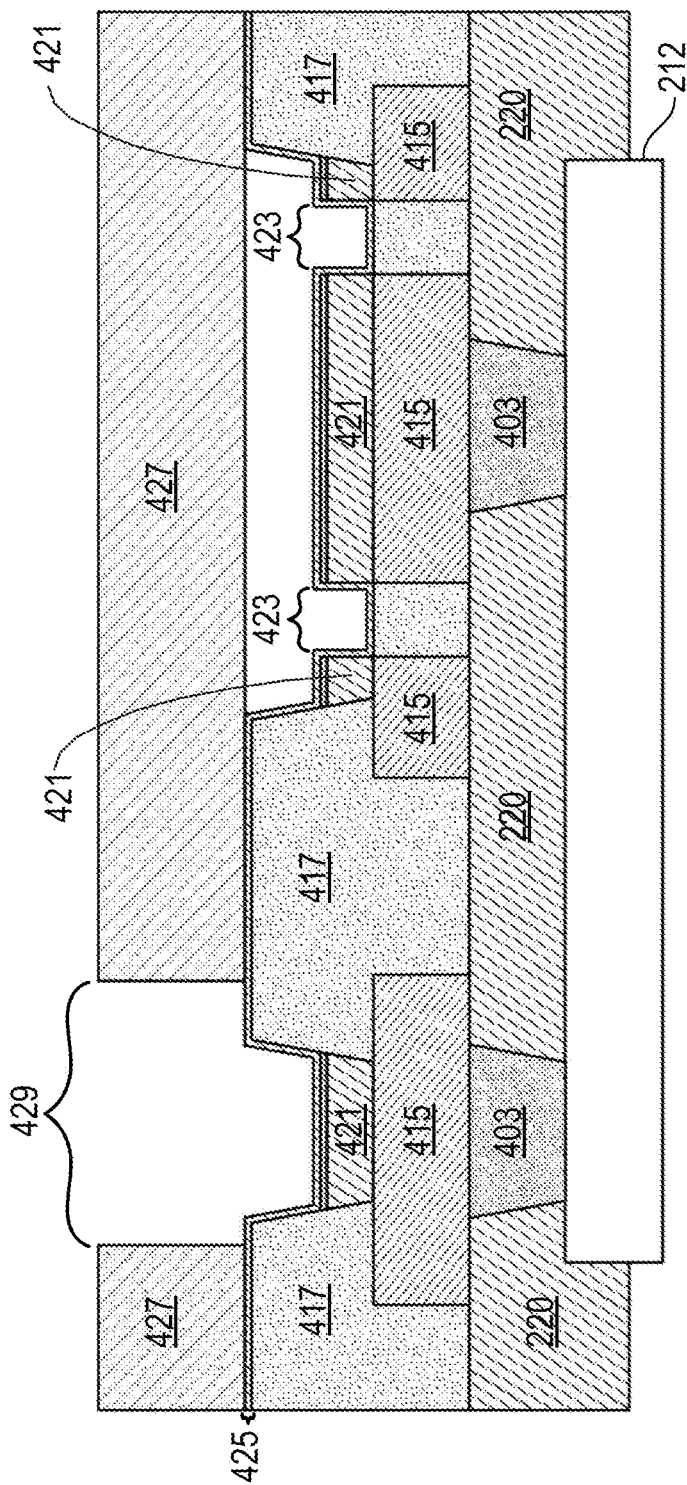
Figure 4M:
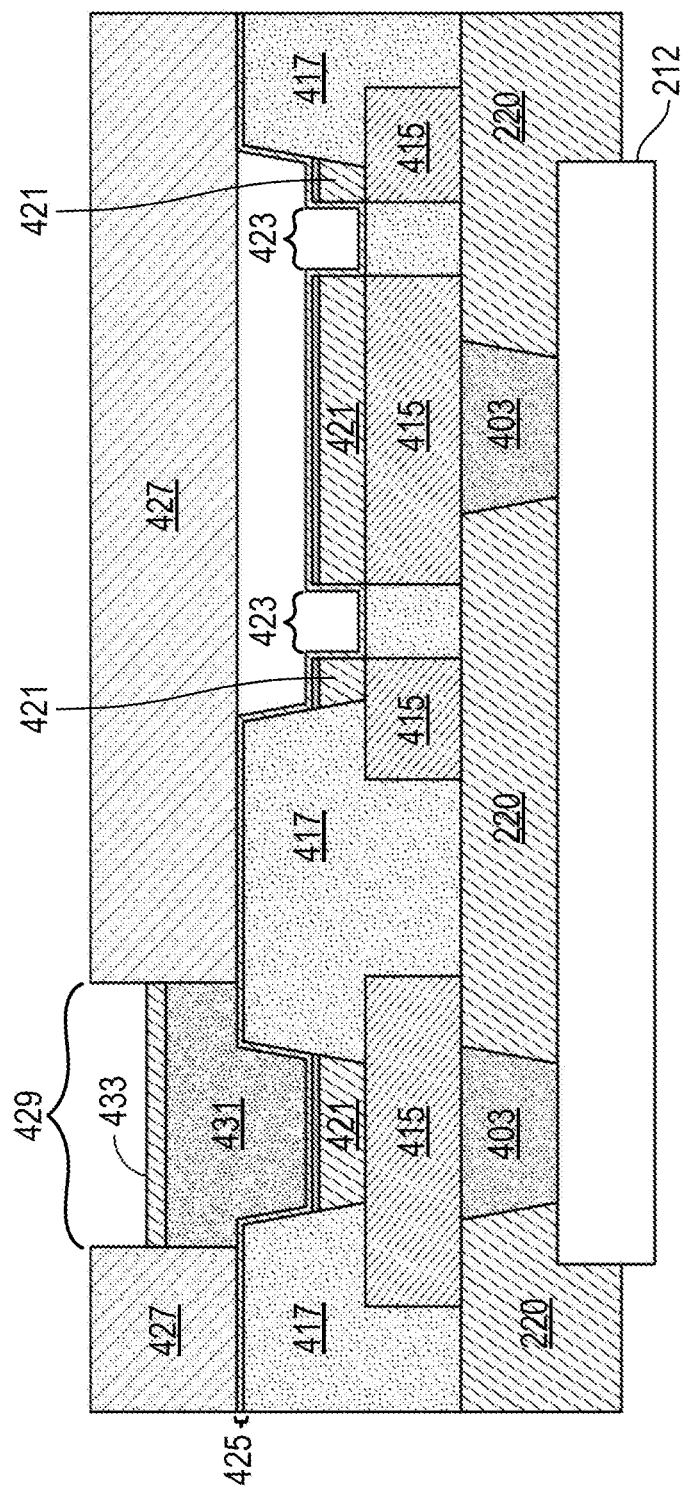
Figure 4N:
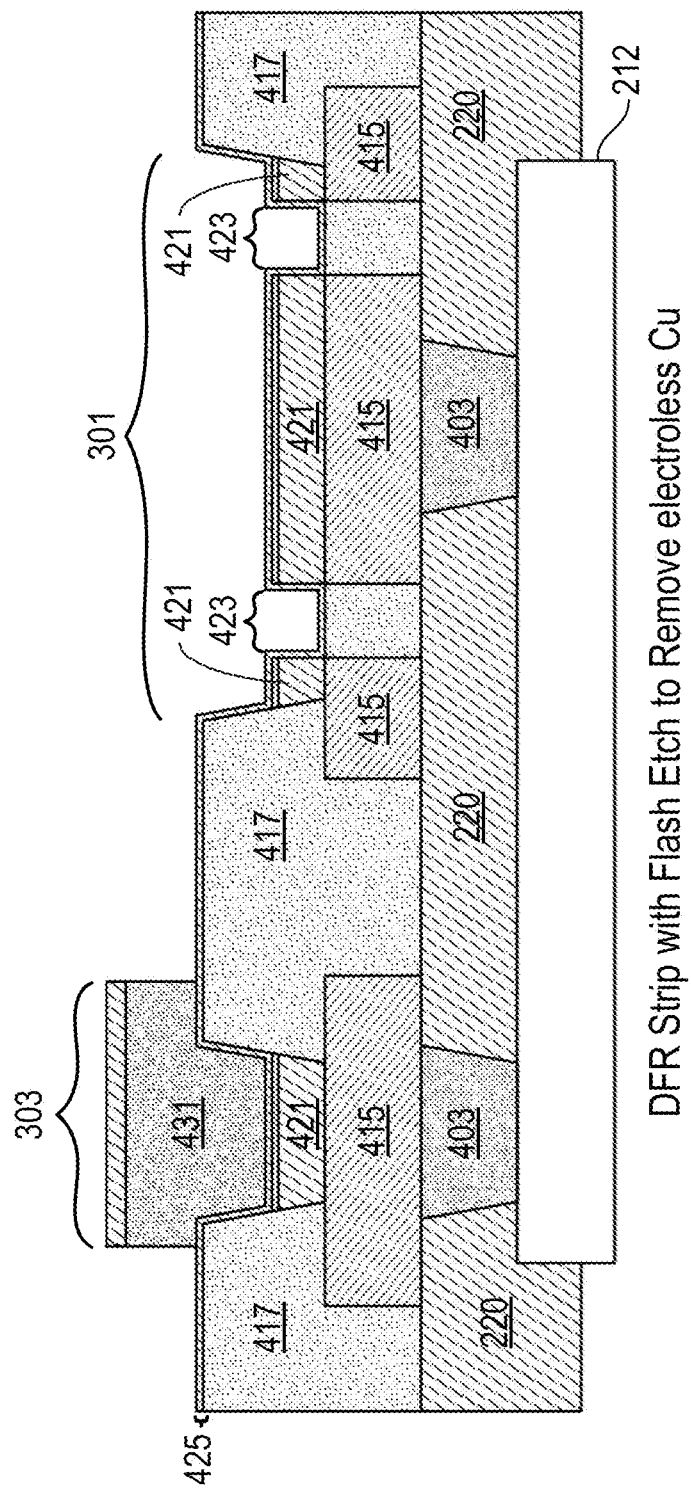

FIGS. 4A-4N are cross-sectional side view illustrations of a method of forming the portion of the semiconductor package shown in FIG. 3 according to one embodiment. For brevity, the method shown in FIGS. 4A-4N omits some operations used in formation of a semiconductor package that includes multiple semiconductor components (e.g., an EMIB, one or more dies, etc.). Persons having ordinary skill in the art will appreciate that omission of these operations avoids obscuring or convoluting the inventive concepts described herein. For one embodiment, the method described in connection with FIGS. 4A-4N begins after a build-up layer 220 is formed on top of an EMIB 212 (e.g., a bulk of the EMIB 212) that is deposited into a cavity formed within one or more build-up layers below and around the EMIB 212. The build-up layers may be disposed on a substrate core or be part of a coreless package. The EMIB 212 may include a bulk portion and one or more metal interconnect layers fabricated on top of the bulk portion. The operations described in connection with FIGS. 4A-4N focus on the one or more metal interconnect layers. More specifically, the operations described in connection with FIGS. 4A-4N focus on fabrication of the contact pad 301 (which includes the contact region 305, the gap region 307, and the non-contact region 309), the interconnect structure 303, and the electrical communications pathway 311, as described above in connection with FIG. 3.

Referring now to FIG. 4A, one or more openings 401 are formed in the build-up layer 220 above the EMIB 212 to reveal a top surface of the EMIB 212 (e.g., a top surface of a bulk portion of the EMIB 212). For one embodiment, the revealed portion(s) of the EMIB 212 is where one or more of the contact pad 301 (which includes the contact region 305, the gap region 307, and the non-contact region 309), the interconnect structure 303, and the electrical coupling mechanism 313 will be formed as described in further detail below. The build-up layer 220 can be formed from an ABF or any other equivalent material used for forming build-up layers. For one embodiment, the openings 401 are formed using a drilling operation, such as a laser ablation technique and/or any other suitable technique for creating openings in the build-up layer 220. Moving on to FIG. 4B, where a desmearing operation and a plating operation are performed. The desmearing operation is performed on the openings 401 to remove epoxy smear caused by the drilling operation. The plating operation is performed (after the desmearing operation) to plate a layer of conductive material 403 (e.g., Cu, etc.) onto the inside surface of the openings 401 using an electroless plating technique or any other suitable technique such that the material 403 fills up the openings 401. For one embodiment, the conductive material 403 used to fill up the openings 401 is co-planar with the build-up layer 220. For other embodiments, the conductive material 403 used to fill up the openings 401 is not co-planar with the build-up layer 220 and may be polished until the conductive material 403 is co-planar with the build-up layer 220.

With regard now to FIG. 4C, a resist layer 405 (e.g., a dry film resist layer, a spin-on resist layer, etc.) is applied on the top surfaces of the build-up layer 220 and the conductive material 403 after the plating operation of FIG. 4B is performed. For one embodiment, at least one of a dielectric layer, a seed layer, a metal layer, or another layer (e.g., a protection layer, a passivation layer, etc.) is applied on the top surfaces of the build-up layer 220 and the conductive material 403 before application of the resist layer 405. The dielectric layer can act as a stress buffer that assists with reducing or eliminating stress-induced damage. The dielectric layer can be deposited before the seed layer is deposited, such that the seed layer is applied on a top surface of the dielectric layer. The dielectric layer may be structured before the seed layer is applied on the dielectric layer.

The seed layer may be made of a suitable metal or metal alloy (e.g., Cu, etc.). The seed layer may be deposited by using, for example, sputtering, electroless deposition, evaporation or any other appropriate technique. For one embodiment, the seed layer may consist of an adhesion promoter/diffusion barrier layer and a layer providing electrical conductivity. For example, the seed layer may be composed of two thin metal layers stacked on each other, where a bottom one of the two layers is the adhesion promoter/diffusion barrier layer and a top one of the two layers is the layer providing electrical conductivity.

Referring again to FIG. 4C, the resist layer 405 that is applied on the top surfaces of the build-up layer 220 and the conductive material 403 can be a spin-on resist layer, a dry film resist layer, or any other suitable resist layer. The resist layer 405 can be applied by spin-coating or any other suitable technology. For one embodiment, the resist layer 405 is one or more thin layers used to transfer a circuit pattern (e.g., a pattern for a contact pad 302, a pattern for an interconnect structure 303, a pattern for an electrical communications pathway 311, etc.) to the top surfaces of the build-up layer 220 and the conductive material 403 on which the resist layer 405 is deposited.

With regard now to FIG. 4D, a photolithography operation 407 is performed after the deposition of the resist layer 405 is performed. For one embodiment, the photolithography operation 407 includes patterning portions of the resist layer 405. More specifically, and for one embodiment, the resist layer 405 can be patterned via lithography to form a (sub)micrometer-scale, temporary mask that protects selected areas of the underlying build-up layer 220 and the conductive material 403 during subsequent processing steps. The material used to prepare said thin layer is typically a viscous solution. The resist layer 405 can be formed from at least one of a polymeric material, an epoxy material, mixtures of polymers, or other small molecules (e.g. photo-acid generators) that have been specially formulated for a given lithography technology. For one embodiment, the resist layer 405 is a photoresist layer, which is a specific type of resist layer used during photolithography. For a further embodiment, the photoresist layer 405 can be a positive photoresist layer or a negative photoresist layer.

Referring again to FIG. 4D, known exposure operations are used to expose selected portions of the resist layer 405. As shown in FIG. 4D, the exposed portions of the resist layer 405 correspond to the areas used for formation of several components, including (but not limited to) the contact pad 301, the interconnect structure 303, and the electrical communications pathway 311. In one embodiment, the exposure operation may include use of masks 409 (e.g., a glass mask, etc.) and ultraviolet (UV) light 411. In this embodiment, the masks 409 are used to prevent against exposure of portions of the resist layer 405. In this way, the unexposed portions of the resist layer 405 are shielded from the UV light 411 by the masks 409. In another embodiment, exposing the resist layer 405 can be performed using one or more techniques— e.g., lithography via at least one of a photolithography stepper or a mask aligner, digital imaging lithography tool via a laser direct imaging tool, maskless lithography via a maskless lithography tool, a combination thereof, etc.

Referring now to FIG. 4E, the exposed portions of the resist layer 405 are etched away to create openings 413 in the resist layer 405. For one embodiment, the openings 413 are spaced such that one or more gaps separate the unexposed portions of the resist layer 405 that were not etched away. As described in further detail below, some of these gaps are used to form the gap region 307 illustrated in FIG. 3. The etching can be performed using techniques—e.g., chemical etching techniques, etc.

With regard now to FIG. 4F, an electrolytic metal plating operation is performed to plate a thick layer of metal 415 (e.g., Cu, etc.) onto the top surfaces of the build-up layer 220 and the conductive material 403 that are not covered by the resist layer 405 so as to fill the openings 413 that remain after removal of exposed portions of the resist layer 405. As shown in FIG. 4F, each pillar of the metal 415 separated by two pillars of the unexposed resist layer 405 is referred to herein as a plated metal structure 415. The plated metal structures 415 may or may not be coplanar with the pillars of the unexposed resist layer 405.

Referring now to FIG. 4G, the unexposed resist layer 405 is removed or stripped leaving the plated metal structures 415 in the form of an image. Finally, a chemical etch (e.g., a flash etch, etc.) is performed, during which portions of the plated metal structures 415 are dissolved. The timing of the etch process is sufficient to remove the entire thickness of the seed layer (if one was applied), where the seed layer was covered during the plating step by the resist layer 405. The etch process removes only a small portion of the plated metal structures 415.

Moving on to FIG. 4H, a solder resist composition 417 is used to encapsulate the plated metal 415 and the uncovered top sides of the build-up layer 220. For one embodiment, encapsulation of the plated metal 415 and the uncovered top sides of the build-up layer 220 is performed by lamination of the solder resist composition 417. As shown in FIG. 4H, at least one side of the build-up layer 220 may be co-planar with corresponding sides of the solder resist composition 417, while each of the plated metal structures 415 and the uncovered top sides of the build-up layer 220 is encapsulated by the solder resist composition 417. Other embodiments, however, are not so limited. For example, a top surface of the solder resist composition 417 may be co-planar with at least one top surface of the metal material 415. For another example, at least one side of the build-up layer 220 may not be co-planar with corresponding sides of the solder resist composition 417. It is to be appreciated that the z-heights of each of the plated metal structure 415 may or may not be equal.

Referring now to FIG. 4I, the solder resist composition 417 may be opened using one or more suitable techniques that create openings 419 within the composition 417. The openings 419 are designed such that: (i) the top surfaces of the plated metal structures 415 are partially or completely uncovered; and (ii) one or more areas of the solder resist composition 417 that are co-planar with the uncovered top surfaces of the plated metal structures 415 are also uncovered. Techniques used to create openings 419 include, but are not limited to, scraping, milling, micro-grinding, chemical stripping and any combination thereof.

With regard now to FIG. 4J, one or more surface finishing processes can be used to coat the uncovered top surfaces of the plated metal structures 415 with a surface finish 421. For one embodiment, the surface finish 421 is formed from one or more of Nickel (Ni), Palladium (Pd), and Gold (Au). For a specific embodiment, the surface finish 421 includes Au and at least one other metal (e.g., NiPdAu, etc.). Application of the surface finish 421 can include a speed-controlling operation that allows for control of the surface finish 421's thickness.

For one embodiment, the surface finish 421 is not used to coat the uncovered areas of the solder resist composition 417 that are co-planar with the uncovered top surfaces of the plated metal structures 415. In this way, gaps 423 between the coated and plated metal structures 415 can be formed. Gaps 423 represent the gap region 307 shown in FIG. 3. For one embodiment, the gaps 423 are filled with a dielectric material (e.g., air, etc.). Furthermore, the coated and plated metal structure 415 that is surrounded by the gaps 423 is used to create the contact region 305 of FIG. 3. Additionally, the coated and plated metal structure 415 that is not adjacent to the gaps 423 is used to create the interconnect structure 303 of FIG. 3. As shown in FIG. 4J, the coated and plated metal structures 415 that are adjacent to the two gaps 423 together with the gaps 423 themselves collectively form the contact pad 301 shown in FIG. 3.

Referring now to FIG. 4K, at least one of a dielectric layer 425, a seed layer 425, a metal layer 425, or another layer 425 (e.g., a protection layer, a passivation layer, etc.) is applied onto the uncovered top surfaces of solder resist composition 417 and the surface finish 421. The dielectric layer, seed layer, metal layer, and other layers are described above in connection with FIG. 4C.

With regard now to FIG. 4L, a resist layer 427 is applied to the top most surface of the layer(s) 425. The resist layer 427 can be similar to the resist layer 405 described above in connection with one or more FIGS. 4A-4F. For one embodiment, the resist layer 427 is applied such that an opening 429 is created over a portion of the coated and plated metal structure 415 that is not adjacent to any of the gaps 423. The size of the opening 429 can be predetermined or determined using an inspection tool, such as a scanner. In this way, the opening 429 may be a large enough area in the x-y dimensions.

Moving on to FIG. 4M, a plating operation is performed to plate a metal 431 (e.g., Cu, etc.) within the opening 429. Additionally, a surface finish 433 is coated on the top surface of the plated metal structure 431. The plating operation and the surface finishing operation are described above, so they are not described again for brevity. The plated metal structure 431 may or may not be similar to or the same as the plated metal structure 415. The surface finish 433 may or may not be similar to or the same as the surface finish 421.

Referring now to FIG. 4N, the resist layer 427 is removed or stripped leaving the coated and plated metal structure 431 (where the plated metal structure has a surface finish 433 coated on the top surface of plated metal structure 431). Finally, a chemical etch (e.g., a flash etch, etc.) is performed, during which portions of the metal 431 are dissolved. The timing of the etch process is sufficient to remove the entire thickness of the layer(s) 425, where it was covered during plating step by the resist layer 427. The etch process removes only a small portion of the thick plated metal structure 431. As shown in FIG. 4N, the interconnect structure 303 of FIG. 3 is created using: (i) the plated metal structure 431 that is coated with a surface finish 433; and (ii) the plated metal structure 415 that is not adjacent to the gaps 423 and coated with a surface finish 421. Also, and as shown in FIG. 4N, the contact pad 301 of FIG. 3 is created using multiple plated metal structures 415 that are adjacent to the two gaps 423, where each of the plated metal structures 415 is coated with a surface finish 421.

For one embodiment, an electrical communications pathway (not shown in FIGS. 4A-4N but shown in FIG. 3) is fabricated to electrically couple the interconnect structure 303 shown in FIG. 4N to the contact pad 301 shown in FIG. 4N. For a specific embodiment, and as explained above in connection with FIG. 3, the contact region 305 of the contact pad 301 is separated from the non-contact region 309 of the contact pad 301 by a gap region 307 filled with dielectric material. Furthermore, and as explained above in connection with FIG. 3, the contact region 305 is the only portion of the contact pad 301 that is electrically coupled to the interconnect structure 303 via the electrical communications pathway (e.g., pathway 311 of FIG. 3, etc.). The electrical coupling of the contact region 305 to the interconnect structure 303 can assist with reducing or eliminating galvanic corrosion.

Figure 5:
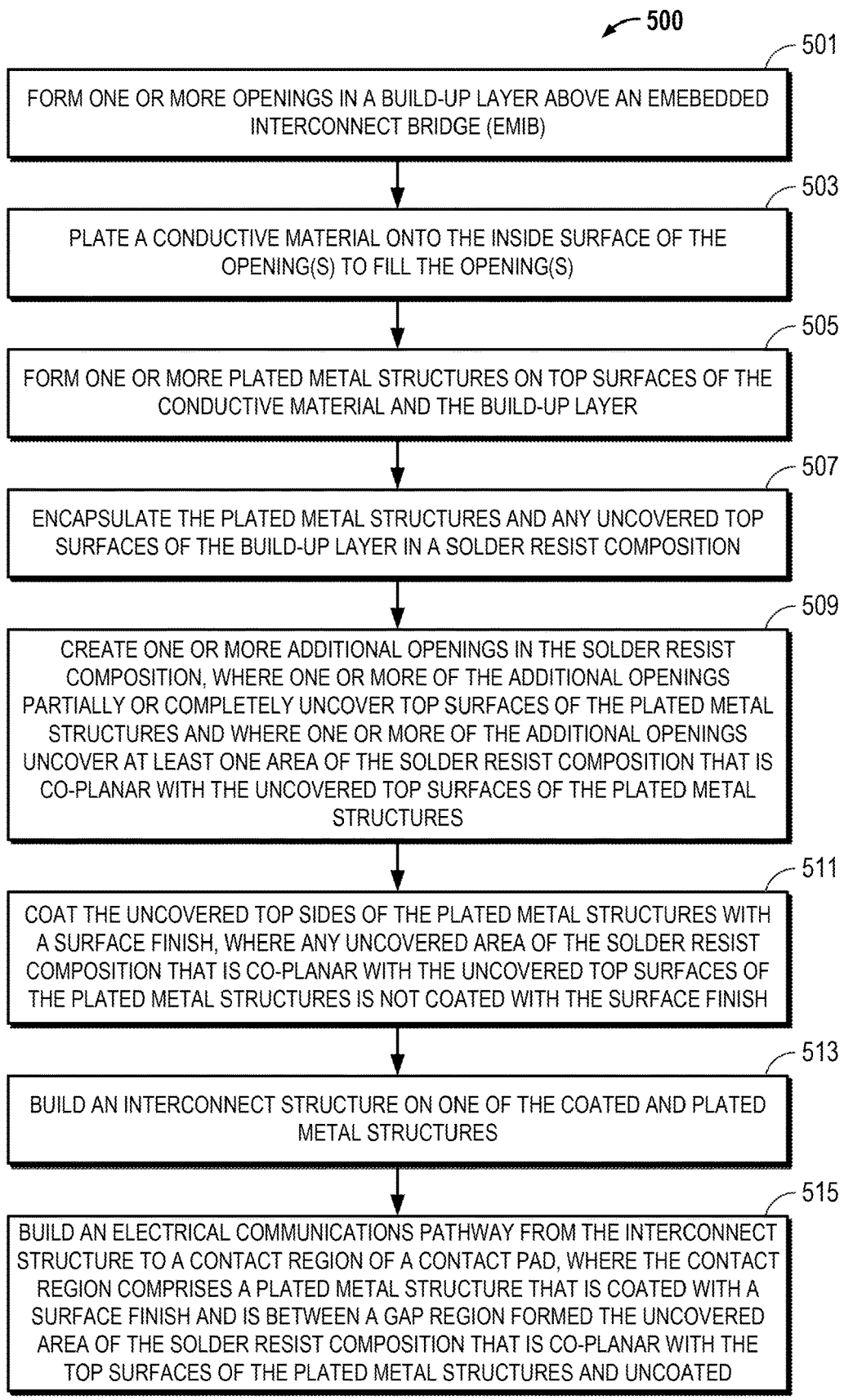
FIG. 5 is a process flow illustration of a method of forming the portion shown in FIG. 3 according to one embodiment.

FIG. 5 is a process flow illustration of a method 500 of forming the portion of the semiconductor package shown in FIG. 3 according to one embodiment. The method 500 begins at operation 501, where one or more first openings are formed in a build-up layer. The build-up layer may be on a conventional packing substrate (also known as a substrate core) or the build-up layer may be on a temporary core used in coreless packaging. The build-up layer may also be on one or more layers that include an embedded semiconductor component (e.g., an EMIB). Next, the method 500 proceeds to operation 503. Here, the method 500 includes plating a conductive material to fill the first opening(s), as described in connection with at least FIGS. 4A-4N and in FIGS. 7A-7O.

The method 500 proceeds to operation 505, which includes plating a conductive metal into the second openings to create plated metal structures, as described in connection with at least FIGS. 4A-4N and in FIGS. 7A-7O. Next, operation 507 includes encapsulating the plated metal structures and any uncovered top surfaces of the build-up layer in a solder resist composition. Operation 507 can be performed as described in connection with at least FIGS. 4A-4N and in FIGS. 7A-7O. The method 500 also includes operation 509. Here, the method 500 includes creating one or more additional or second openings in the solder resist composition. For one embodiment, the second opening(s) partially or completely uncover top surfaces of the plated metal structures. Also, and for one embodiment, the second opening(s) uncover at least one area of the solder resist composition that is co-planar with the top surfaces of the plated metal structures. Operation 509 can be performed as described in connection with at least FIGS. 4A-4N and in FIGS. 7A-7O. At operation 511, the method 500 includes coating the uncovered top surfaces of the plated metal structures with a surface finish. For one embodiment, any uncovered area of the solder resist composition that is co-planar with the uncovered top surfaces of the plated metal structures is not coated with the surface finish. In this way, one or more gaps may be formed between the coated and plated metal structures. An example of operation 511 is described in connection with at least FIGS. 4A-4N and in FIGS. 7A-7O. The coated and plated metal structures that are adjacent to the two gaps together with the two gaps themselves collectively form a contact pad (e.g., a contact pad 301 that includes a contact region 305, a gap region 307, and a non-contact region 309, as described above in connection with FIG. 3).

The method 500 proceeds to operation 513, where an interconnect structure is built on one of the coated and plated metal structures, as described in connection with at least FIGS. 4A-4N and in FIGS. 7A-7O. For one embodiment, the interconnect structure and the contract region of the contact pad are designed such that their surface areas are substantially equal. The method 500 may conclude with operation 515. Here, the method 500 includes building an electrical communications pathway between the interconnect structure and the contact region of the contact pad. Examples of operations 533 and 535 are described above in connection with FIGS. 3, 4A-4N, and 7A-7O. For one embodiment, the electrical communications pathway is bonded to the interconnect structure and the contact region of the contact pad. For one embodiment, no other part of the contact pad (except the contact region) is electrically coupled to the interconnect structure.

Figure 6A:
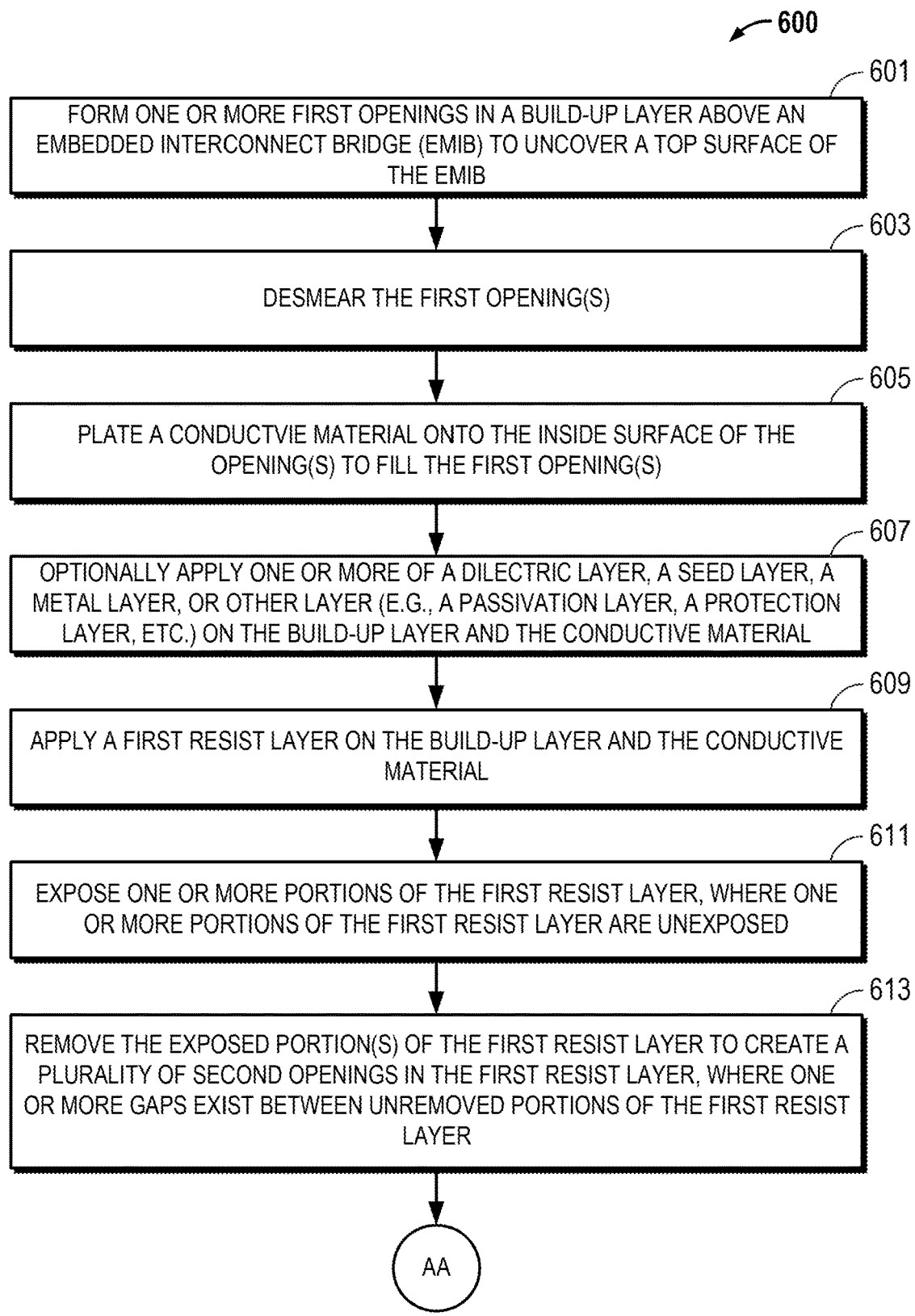
FIGS. 6A-6C are a process flow illustration of a method of forming the portion shown in FIG. 3 according to another embodiment.
Figure 6B:
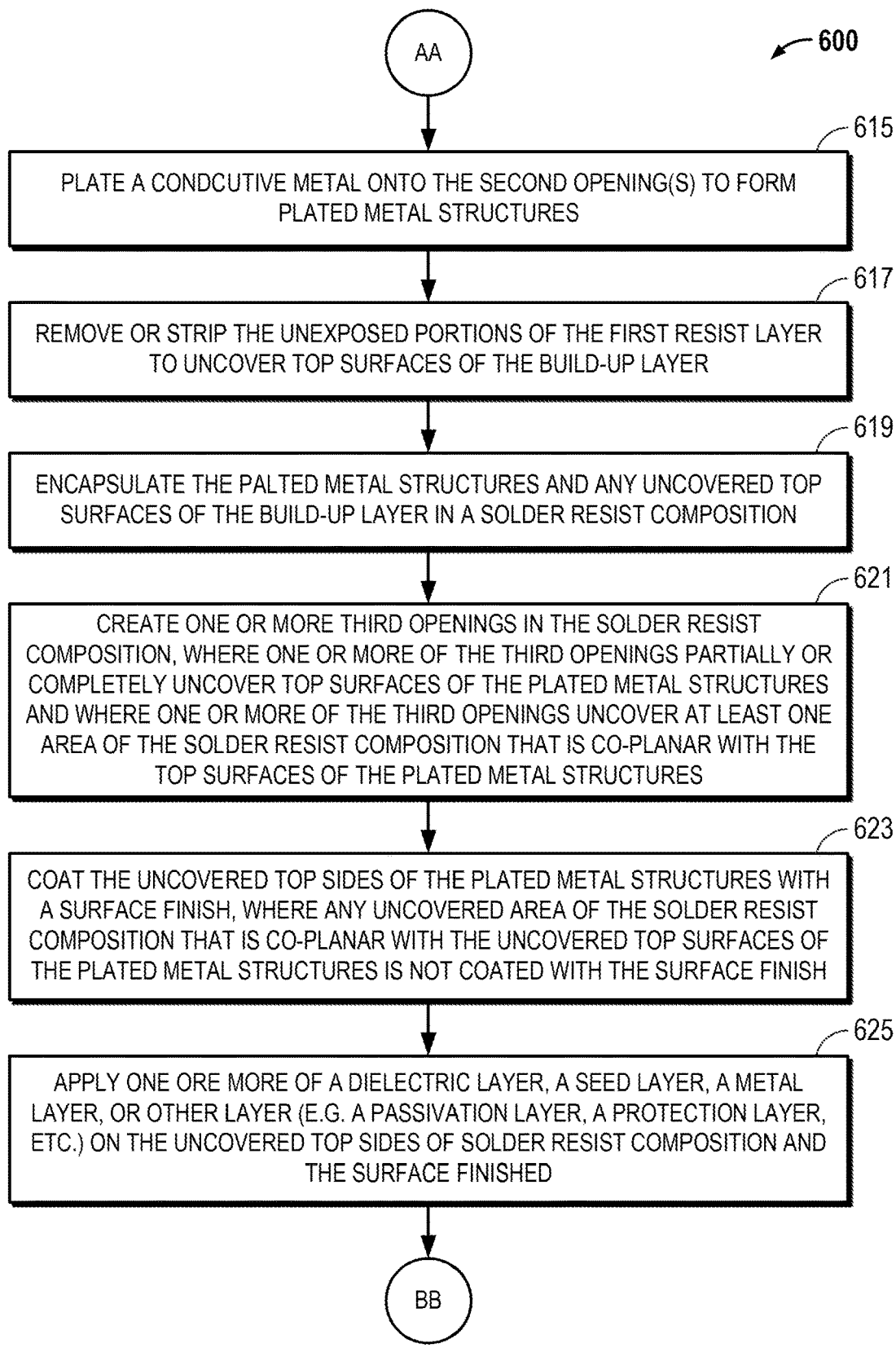
Figure 6C:
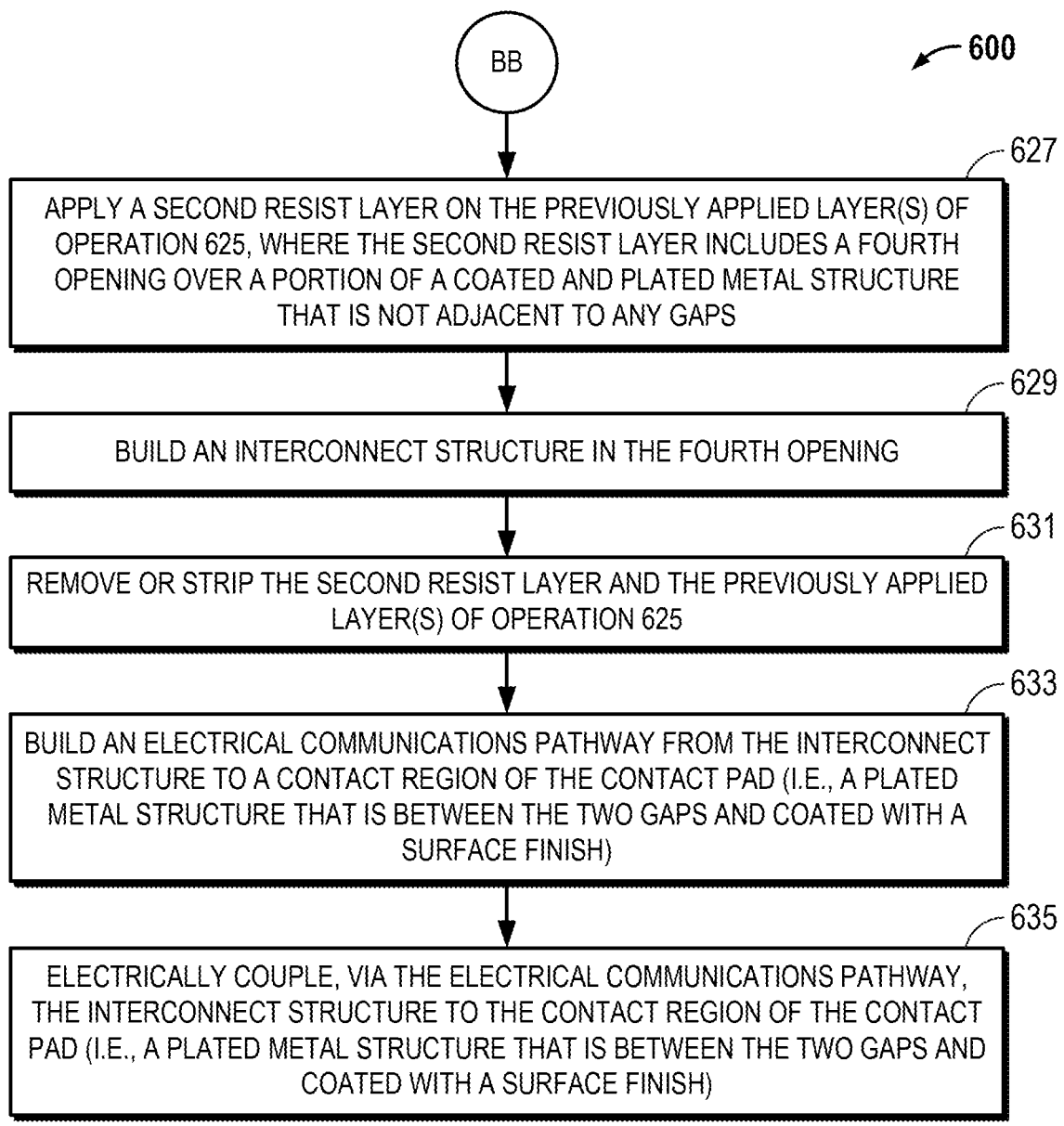

FIGS. 6A-6C are a process flow illustration of a method 600 of forming the portion of the semiconductor package shown in FIG. 3 according to one embodiment. The method 600 may be viewed as a non-limiting example of the method 500 that includes more details.

As shown in FIG. 6A, the method 6A begins at operation 601. Here, one or more first openings are formed in a build-up layer as described in connection with at least FIGS. 4A-4N and in FIGS. 7A-7O. Next, the method 600 proceeds to operation 603 of FIG. 6A. Here, a desmearing operating is performed on the first opening(s) as described above in connection with FIG. 4B. Operation 605 includes plating a conductive material to fill the first opening(s), as described above in connection with FIG. 4B.

The method 600 can also include an optional operation 607. Here, one or more of a dielectric layer, a seed layer, a metal layer, or other layer (e.g., a passivation layer, a protection layer, etc.) is applied on the build-up layer and the conductive material, as described above in connection with FIG. 4C. Operation 609 includes application of a first resist layer on the build-up layer and the conductive material. Operation 609 may be performed in accord with the description provided above in connection with FIG. 4C.

Operations 611 and 613 respectively include exposing portions of the first resist layer and removing the exposed portions to create plurality of second openings in the first resist layer. In operation 613, removal of the exposed portions of the first resist layer includes creating one or more gaps between unremoved portions of the first resist layer. Operations 611 and 613 may be performed according to the descriptions provided above in connection with FIGS. 4D and 4E, respectively.

Referring now to FIG. 6B, here the method 600 proceeds to operation 615. Operation 615 includes plating a conductive metal onto the second openings to create plated metal structures, as described above in connection with FIG. 4F. At operation 617 of FIG. 6A, the unexposed portions of the first resist layer are stripped away as described above in connection with FIG. 4G. Operation 619 of FIG. 6B includes encapsulating the plated metal structures and the exposed top portions of the build-up layer in a solder resist composition. Operation 619 can be performed as described above in connection with FIG. 4H. Operation 621 includes creating one or more third openings in the solder resist composition. One or more of the created third openings may partially or completely uncover top surfaces of the plated metal structures. Also, one or more of the created third openings may uncover at least one area of the solder resist composition that is co-planar with the top surfaces of the plated metal structures. Operation 621 can be performed in accord with the description above provided in connection with FIG. 4I. Next, the method 600 proceeds to operation 623, which includes coating the uncovered top surfaces of the plated metal structures with a surface finish. In operation 623, any uncovered area of the solder resist composition that is co-planar with the uncovered top surfaces of the plated metal structures is not coated with the surface finish. In this way, one or more gaps may be formed between the coated and plated metal structures. An example of operation 623 is described above in connection with FIG. 4J. The coated and plated metal structures that are adjacent to the two gaps together with the two gaps themselves collectively form a contact pad (e.g., a contact pad 301 that includes a contact region 305, a gap region 307, and a non-contact region 309, as described above in connection with FIG. 3).

The method 600 proceeds to operation 625. Here, one or more of a dielectric layer, a seed layer, a metal layer, or other layer (e.g., a passivation layer, a protection layer, etc.) are applied onto uncovered top surfaces of the solder resist composition and the surface finish. This operation is described above in connection with FIG. 4K. The method 600 includes operation 627, which includes applying a second resist layer on the previously applied layer(s) described above in connection with operation 625. In operation 627, the second resist layer is applied such that a fourth opening is created over a coated and plated metal structure that is not adjacent to any gaps. An example of operation 627 is described above in connection with FIG. 4L.

Next, the method 600 proceeds to operation 629, where an interconnect structure is built in the fourth opening, as described above in connection with FIGS. 4M-4N. Operation 631 includes stripping the second resist layer and the previously applied layer(s) of operation 625. An example of this operation is described in connection with FIG. 4N. The method 600 concludes with operations 633 and 635, which include building an electrical communications pathway between the interconnect structure and the contact region of the contact pad. Examples of operations 633 and 635 are described above in connection with FIGS. 3, 4M-4N, and 5.

Each of the operations in the methods 500 and 600 may be achieved using one or more different processes. In many cases, the selection of one process over another is merely a design choice, where any of several processes would be satisfactory. In other cases, selection of the process is influenced by factors such as, e.g., materials involved, cost, scale, etc. Because such processes are well known and understood, they will not be described in detail where the choice of process is not material to the disclosure.

Figure 7A:
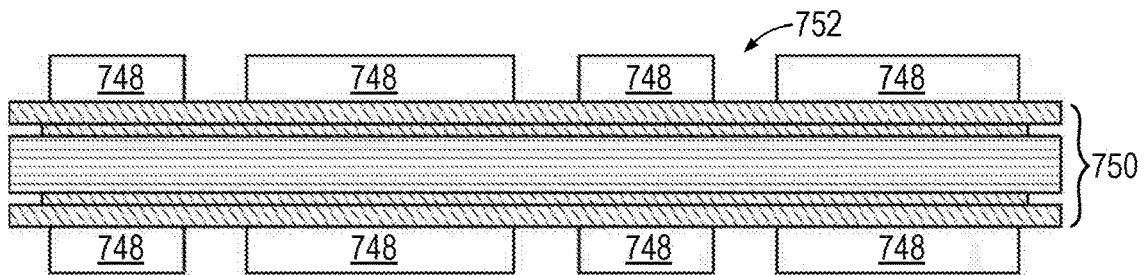
FIGS. 7A-7O are cross-sectional side view illustrations of a method of forming a coreless semiconductor package that may include the portion shown in FIG. 3 according to one embodiment.
Figure 7B:
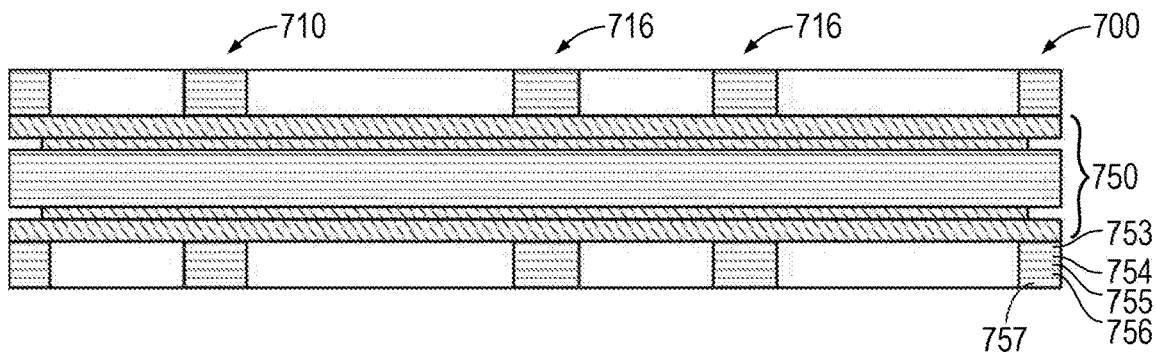
Figure 7C:
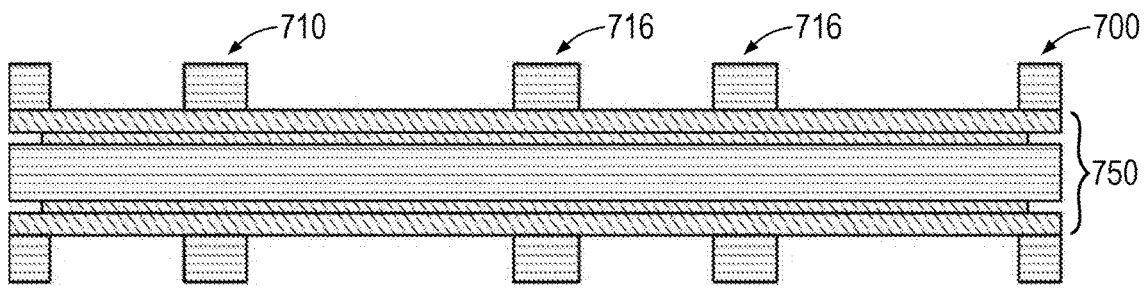
Figure 7D:
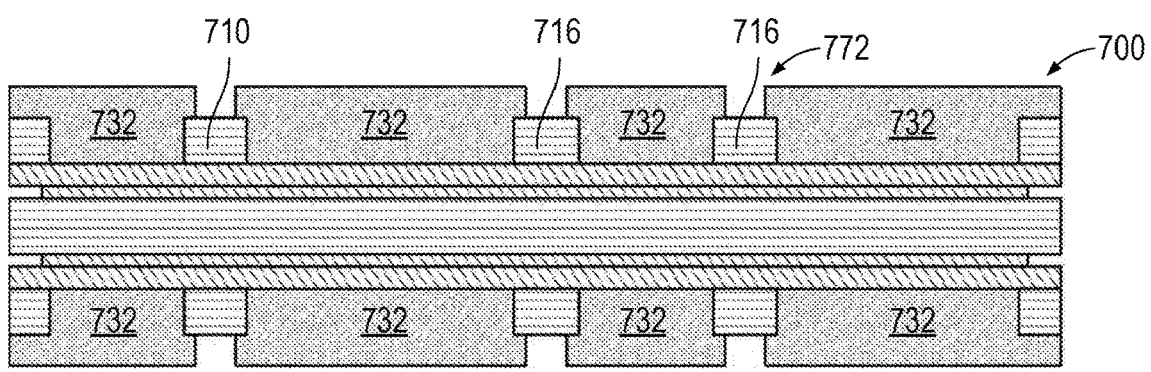
Figure 7E:
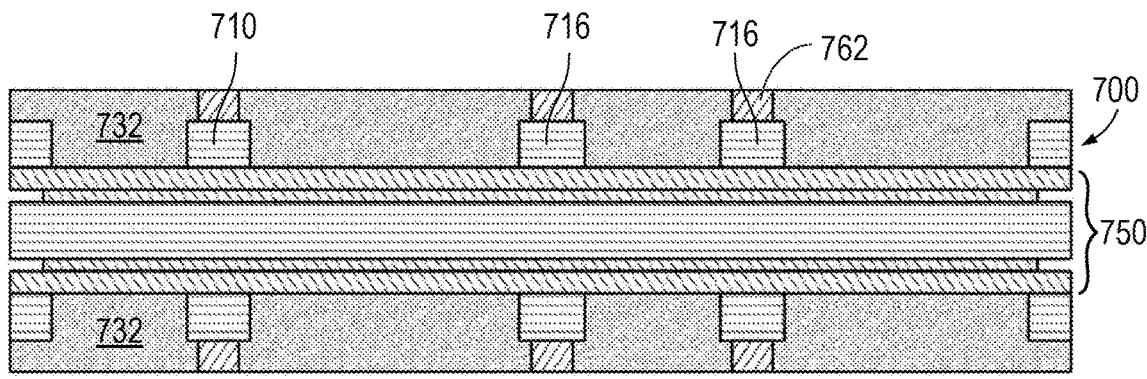
Figure 7F:
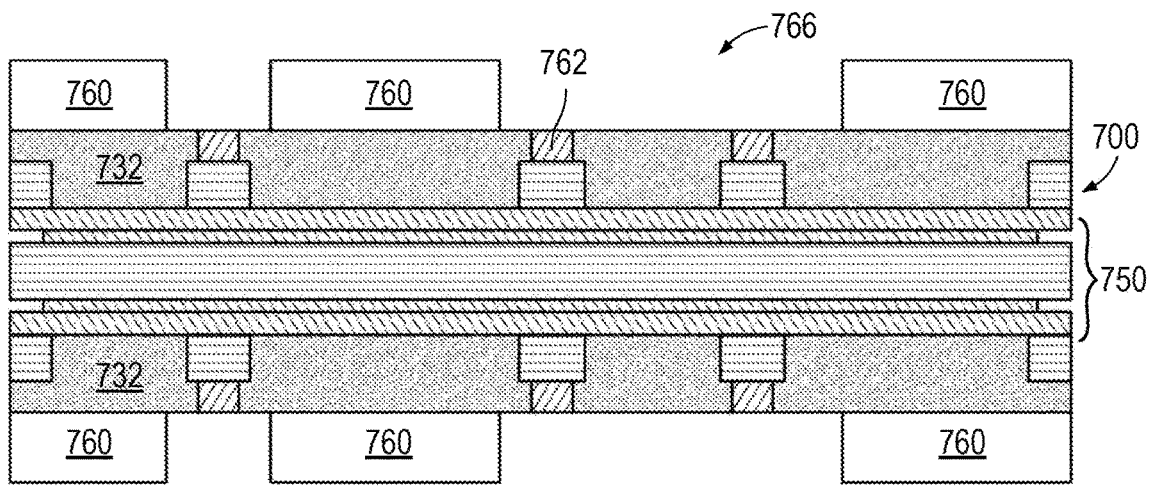
Figure 7G:
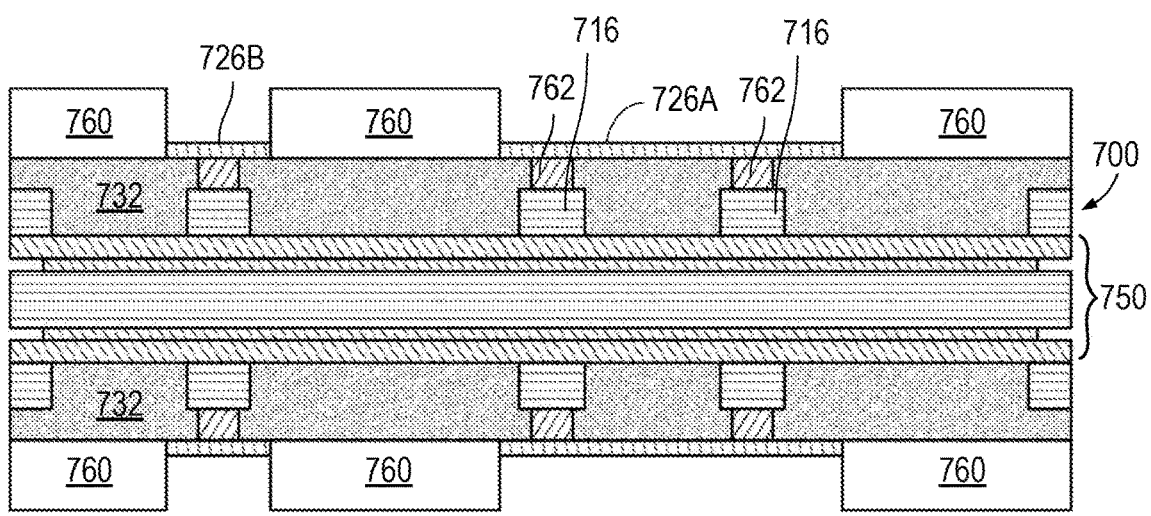
Figure 7H:
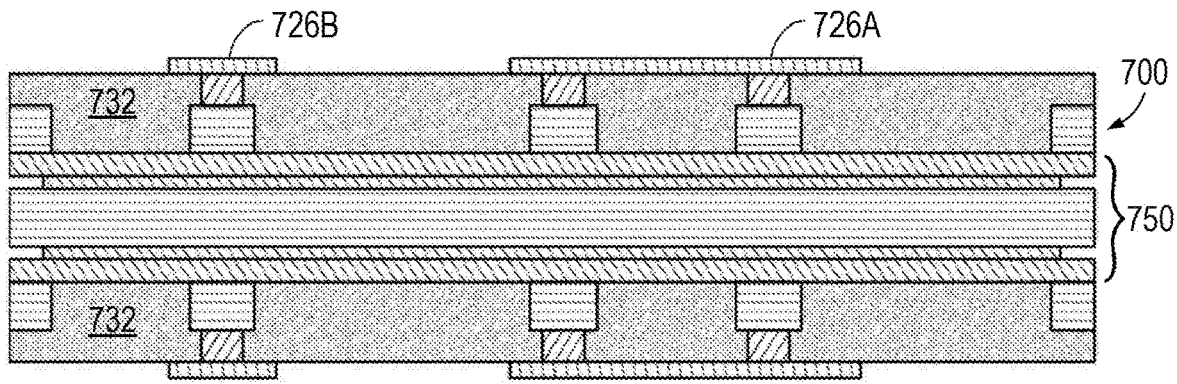
Figure 7I:
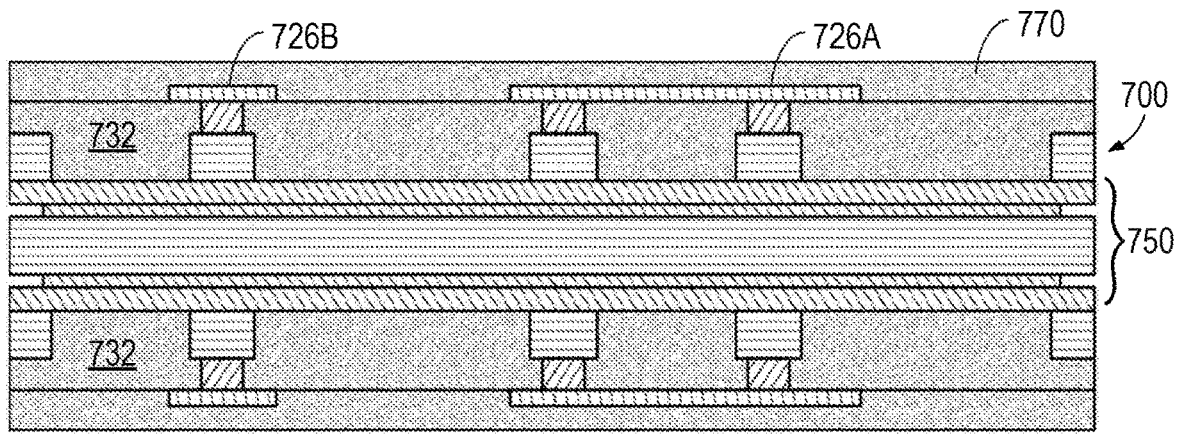
Figure 7J:
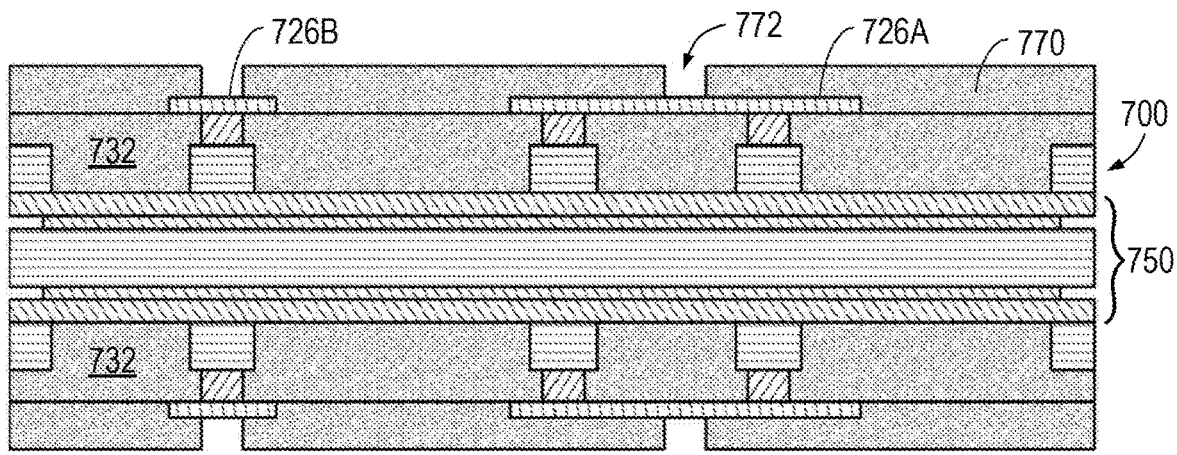
Figure 7K:
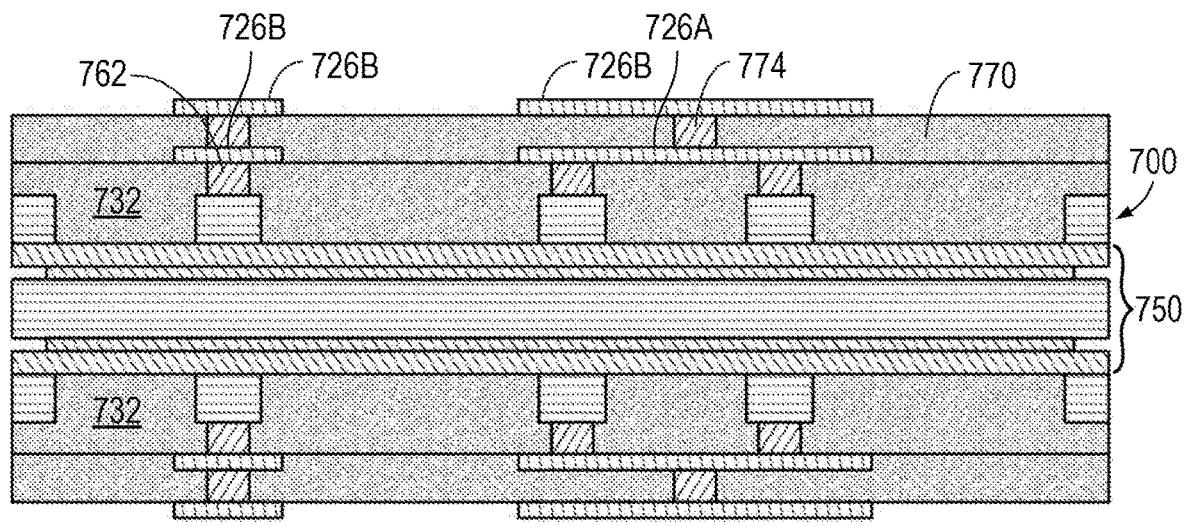
Figure 7L:
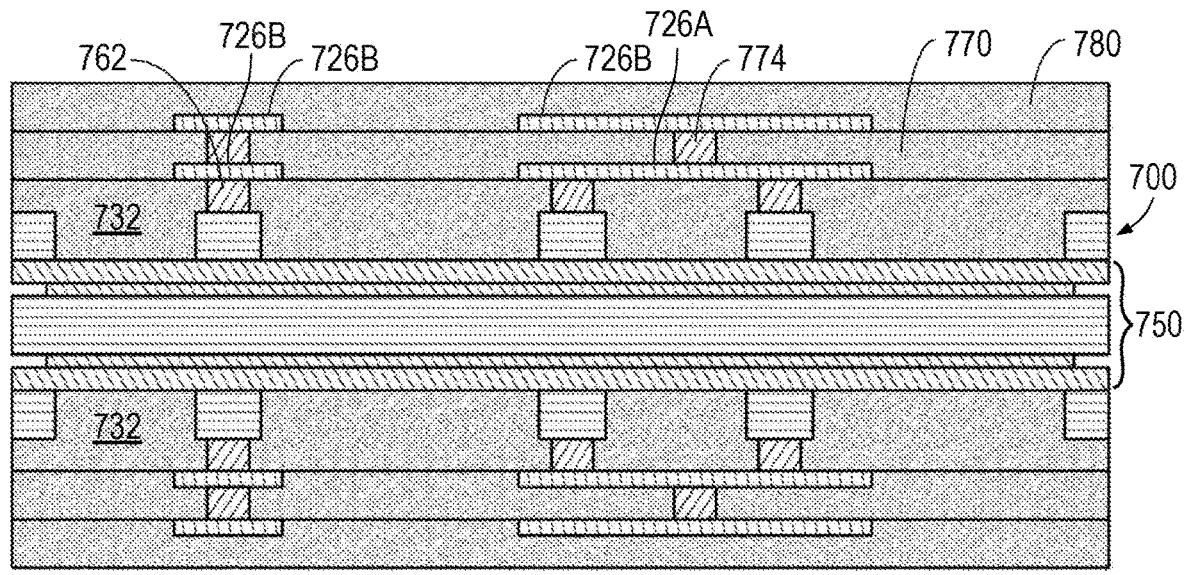
Figure 7M:
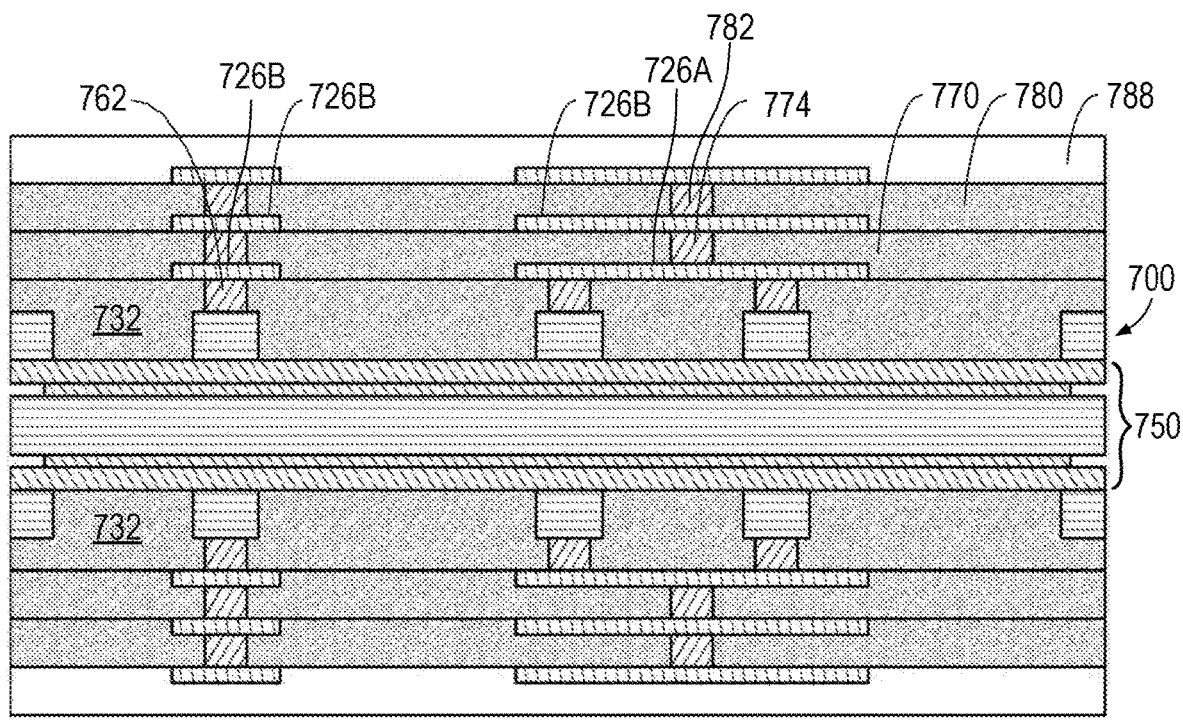
Figure 7N:
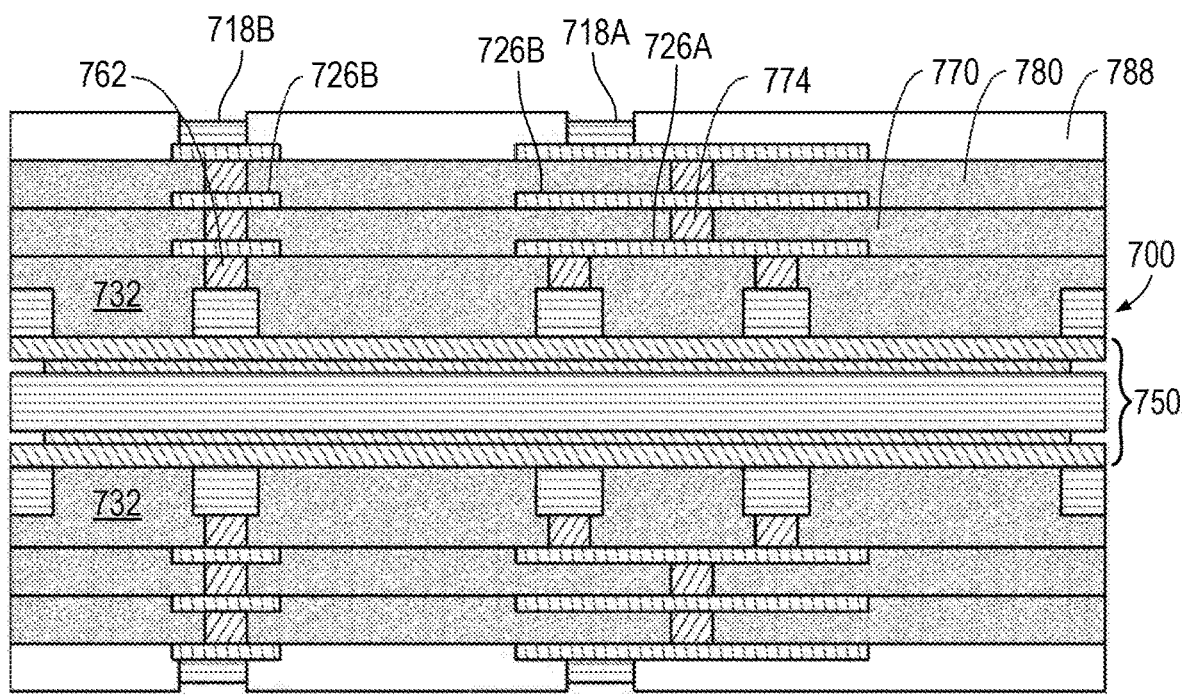
Figure 7O:
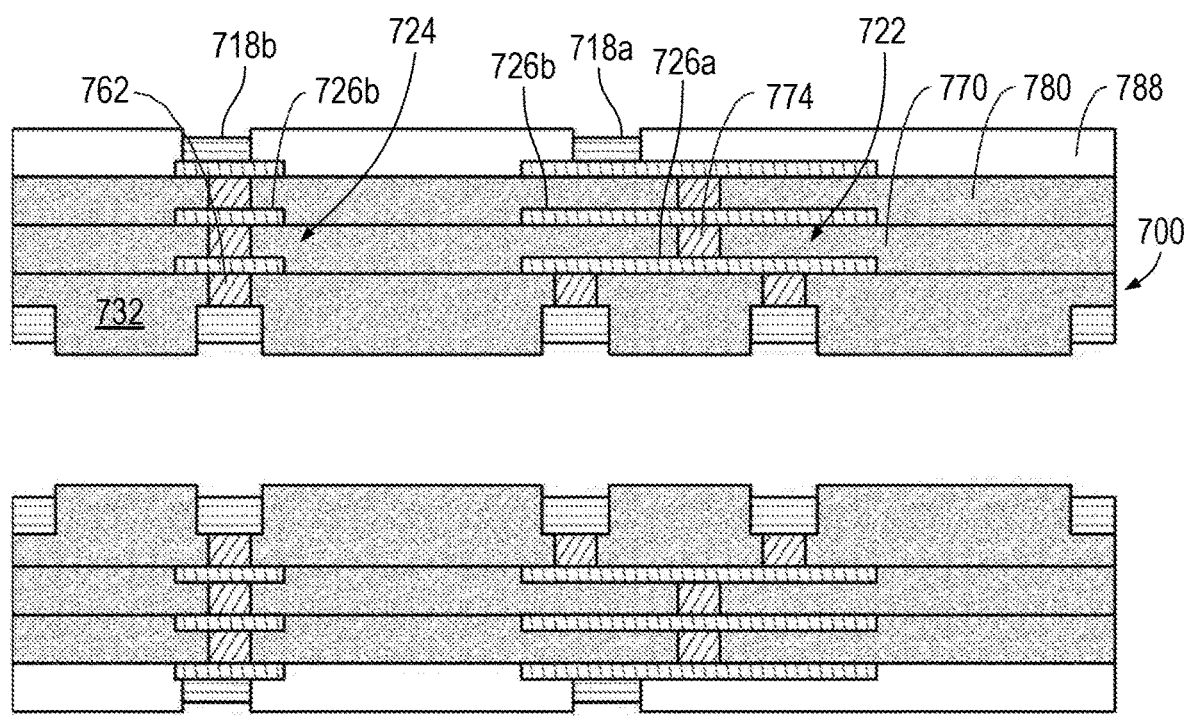

FIGS. 7A-7O are cross-sectional side view illustrations of a method of forming a coreless semiconductor package 700 that may include the portion shown in FIG. 3 according to one embodiment. For brevity, the method shown in FIGS. 7A-7O omits some operations used in formation of a semiconductor package that includes multiple semiconductor components (e.g., an EMIB, one or more dies, etc.). Persons having ordinary skill in the art will appreciate that omission of these operations avoids obscuring or convoluting the inventive concepts described herein.

With regard now to FIG. 7A, one or more coreless structures 700 may be formed on a blank panel 750 (which can also be referred to as a detach core 750). This blank panel 750 may be a peelable core, and may be constructed with various materials, such as copper (Cu), or one or more other suitable materials, metals, or metal alloys. For example, a blank panel 750 may include several layers of epoxy resin disposed between layers of copper.

The operations described in connection with FIGS. 7A-7O focus on fabrication of the contact pad 301 (which includes the contact region 305, the gap region 307, and the non-contact region 309), the interconnect structure 303, and the electrical communications pathway 311, as described above in connection with FIG. 3. In various embodiments, structures may be formed on a first side of the blank panel 750 and also on the opposite second side of the blank panel 750. In one embodiment, the structures on the sides of the blank panel 750 include at least one build-up layer, at least one metal layer, and/or at least one other layer. The build-up layer may be disposed on the blank panel 750 or on other layers (e.g., other build-up layers, etc.) on the blank panel 750.

In one scenario, a resist layer 748 may be deposited on the build-up layer that is on the peelable core 750. Alternatively, the resist layer 748 may be deposited directly on the peelable core 750. Next, and as shown in FIG. 7A, a patterned resist layer 748 may be formed on blank panel 750. The patterned resist layer 748 may be formed by applying a spin-on resist layer, a dry film resist layer, or any other suitable resist layer and patterning the resist layer using known lithographic techniques. For example, a dry film resist may be patterned by using a photo mask and ultraviolet (UV) light to create openings 752 through the dry film resist to the surface of blank panel 750 or the surface of build-up film on the blank panel 750. For one embodiment, the patterned resist layer 748 includes one or more thin layers used to transfer a circuit pattern to the surface of blank panel 750 or the surface of build-up film on the blank panel 750. The transferred circuit pattern can include, for example, a pattern for a contact pad 302, a pattern for an interconnect structure 303, a pattern for an electrical communications pathway 311, etc.

Referring now to FIG. 7B, electrical routing features 710 (e.g., an electrical communications pathway or a trace, an interconnect structure, etc.) and contact pads 716 may be formed in the openings 752 of the patterned resist layer. In some embodiments, forming electrical routing features 710 and/or contact pads 716 may include depositing metal layers in openings 752. In some embodiments, contact pads 716 may be formed as described above in connection with at least one of FIGS. 1-6C. In other embodiments, contact pads 716 may include a plurality of metal layers. The outermost layers may be copper, or anything suitable metal or metal alloy. In one embodiment, the contact pads 716 include one or more embodiments of a contact pad as described herein (e.g., a contact pad 301 that includes a contact region 305, a gap region 307, and a non-contact region 309, as described above in connection with FIG. 3).

In some embodiments, a first metal layer 753, such as a layer of copper, may be deposited or plated into openings 752 on the surface of blank panel 750. One or more additional metal layers may be formed on first metal layer 753. For example, a second metal layer 754 may be formed on first metal layer 753, a third metal layer 755 may be formed on second metal layer 754, a fourth metal layer 756 may be formed on third metal layer 755. In various embodiments, a fifth metal layer 757 may be formed on fourth metal layer 756. For example, in some embodiments, second metal layer 754 may be gold, third metal layer 755 may be palladium, and fourth metal layer 756 may be nickel. Fifth metal layer 757 may be copper. In other embodiments, electrical routing features 710 and/or contact pads 716 may include fewer or more layers of metal or other conductive materials.

With regard to FIG. 7C, the patterned resist layer 748 may be removed from blank panel 750. The patterned resist layer 748 may be stripped by conventional methods, such as by use of available resist stripping chemicals/techniques. Furthermore, a dielectric layer may be formed on electrical routing features 710 and contact pads 716 to form a first outer layer 732. The first outer layer 732 may be a dielectric material such as ABF laminate.

In FIG. 7D, vias 772 may be formed through the layer 732 (e.g., a dielectric layer, etc.) to electrical routing features 710 and contact pads 716. Vias 772 may be formed as described above (e.g., by laser drilling, any other suitable technique, etc.). Vias 772 can be similar to or the same as any of the vias described above in connection with at least FIGS. 1-6C.

Referring now to FIG. 7E, a conductive layer 762 may be formed on the first outer layer 732 (i.e., on the layer 732 and in vias 772). The conductive layer 762 may be formed by various plating techniques as described above. In some embodiments, conductive layer 762 may be a layer of copper or any other suitable metal or metal alloy formed by an electroless plating process. Conductive layer 762 may thinly cover the outer surface of the layer 732 (e.g., a dielectric layer, etc.). In some embodiments, the conductive layer 762 may be formed as discontinuous layer, extending over less than the entire surface of an underlying layer (e.g., layer 732, etc.). Furthermore, one or more build-up layers may be formed on the conductive layer 762.

Moving on to FIG. 7F, a patterned resist layer 760 may be formed on a build layer that is on the conductive layer 762. In a specific embodiment, the patterned resist layer 760 may be formed on the conductive layer 762. In various embodiments, the patterned resist layer 760 may be formed by laminating a layer of dry film resist (DFR) or other suitable resist onto conductive layer 762 and patterning the layer of DFR by known lithographic processes (e.g., photo mask and UV light, etc.). In other embodiments, patterned resist layer 760 may be formed using another material such as a liquid film. Patterned resist layer 760 includes openings 766, through which portions of conductive layer 762 not covered by patterned resist layer 760 are exposed.

FIG. 7G shows that conductive elements 726A-B may be formed on the exposed portions of conductive layer 762 in openings 766 of patterned resist layer 760. Again, contact pads 716 may be connected to conductive element 726A by conductive layer 762. Conductive elements 726A-B and conductive layer 762 may be formed from a conductive material, such as one or more metals. In various embodiments, conductive elements 726A-B and conductive layer 762 may be formed from copper or any other suitable metal or metal alloy (e.g., Ni, Sn, Pd, Au, NiSn, CuSn, NiPdAu, etc.). In some embodiments, conductive elements 726A-B may be formed by an electrolytic plating process. For example, in various embodiments, conductive elements 726A-B may be formed by an electrolytic copper plating process. In other embodiments, one or both of conductive layer 762 and conductive elements 726A-B may be formed by another known process for forming electrical paths. In other embodiments, conductive elements 726B may be formed and a conductive element 726A may be formed on or between additional build-up layers.

In FIG. 7H, the patterned resist layer 760 may be removed to expose the portions of layer 732 and/or the conductive layer 762 not covered by conductive elements 726A-B. Patterned resist layer 760 and uncovered portions of layer 732 and/or conductive layer 762 may be removed stripping, etching, or any other suitable technique.

With regard now to FIGS. 7I-7J, a dielectric layer 770 may be formed on the first outer layer 732 and conductive elements 726A-B (See FIG. 7I). The dielectric layer 770 may, for example, comprise ABF laminate or any other suitable laminate. In one embodiment, vias 772 may be formed through dielectric layer 770 to conductive elements 726A-B. These vias are similar to or the same as the vias described above in connection with FIGS. 1-6C.

Referring now to FIG. 7K, a second conductive layer 774 may be formed on dielectric layer 770 and vias 772. In some embodiments, second conductive layer 774 may be formed using the same or similar materials and processes as described above with regard to first conductive layer 762.

In FIG. 7K, a patterned resist layer and additional conductive elements 726B may be formed as described above. The patterned resist layer may then be stripped, and the portions of the second conductive layer 774 uncovered by removal of the patterned resist layer may be removed, again as described above. Dielectric layer 770 may form a first build-up layer. Conductive layer 762 and conductive elements 726A-B may be disposed between dielectric layer 770 and first outer layer 732. Conductive layer 774 and additional conductive elements 726B may be disposed between dielectric layer 770 and a second build-up layer.

Next, in FIG. 7L, an additional one or more build-up layers may be formed on dielectric layer 770 and corresponding conductive elements 726B using the same or similar processes and materials. An example of coreless substrate 700 after the addition of a second dielectric layer 780 for the formation of a second build-up layer is shown in FIG. 7L. Again, the conductive element that connects contact pads 716 is indicated as 726A, and other conductive elements are indicated as 726B.

Moving on to FIG. 7M, a solder resist layer 788 may be formed on the outermost build-up layer 780. In this way, a coreless substrate 700 with two build-up layers between solder resist layer 788 and first outer layer 732 is formed. The two build-up layers include dielectric layers 770 and 780, conductive layers 762, 774, and 782, and conductive elements 726A-B. Other embodiments may have less or more than two build-up layers.

With regard now to FIG. 7N, openings may be formed through solder resist layer 788 to conductive elements 726B.

Openings may be formed by conventional methods. In various embodiments, solder resist layer 788 may be formed from a photo reactive material and patterned by known lithographic processes. For example, openings may be formed in solder resist layer 788 by applying a photo mask and ultraviolet (UV) light. Additionally, electrical routing features 718A-B may be formed in the openings in solder resist layer 788. In one embodiment, the electrical routing features 718A-B include one or more of the contact pad, the interconnect structure, and the electrical communications pathway described above in connection with at least FIG. 3.

In various embodiments, electrical routing features 718A-B may be formed by plating or otherwise depositing one or more conductive layers (e.g., metal layer(s)). In some embodiments, electrical routing features 718A-B may include one or more layers of nickel, palladium, gold, any other suitable metal, any other suitable metal alloy, etc. In other embodiments, electrical routing features 718A-B may include a layer of electroless nickel immersion gold (ENIG) or ENIG and electroless gold (ENIG EG); electroless Nickel, electroless Palladium and Immersion gold (EN-EPIG); immersion Tin (ImSn); direct immersion gold (DIG); organic preservative Solderability (OSP); electroless Palladium immersion gold (EPIG). In various embodiments, electrical routing features 718A-B may be contact pads, as described above in connection with at least FIG. 3. With regard now to FIG. 7O, the electrical routing feature 718A (e.g., one or more embodiments of a contact pad as described herein) may be electrically coupled with electrical routing feature 716 (e.g., one or more embodiments of a contact pad as described herein) by the first electrical path 722. Also, the electrical routing feature 718B (e.g., one or more embodiments of a contact pad as described herein) may be electrically coupled with the electrical routing feature 710 (e.g., one or more embodiments of a contact pad as described herein) by the second electrical path 724.

As shown in FIG. 7O, the coreless substrates 700 may be removed from blank panel 750 by cutting or otherwise severing the lateral ends of blank panel 750 and separating the outermost metal layers from the next adjacent metal layers, leaving the next adjacent metal layers attached to the epoxy resin core. The outermost metal layers of the blank panel 550 may remain attached to the coreless substrate(s) 700. The outermost copper layers may be removed from coreless substrate(s) 700 by an etching process. First, a metal layer may be removed using the same or similar etching process. In some embodiments, the first metal layer may be a layer of copper, the second metal layer may be a layer of gold, and the first metal layer may be removed to expose the surface of second metal layer.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 8:
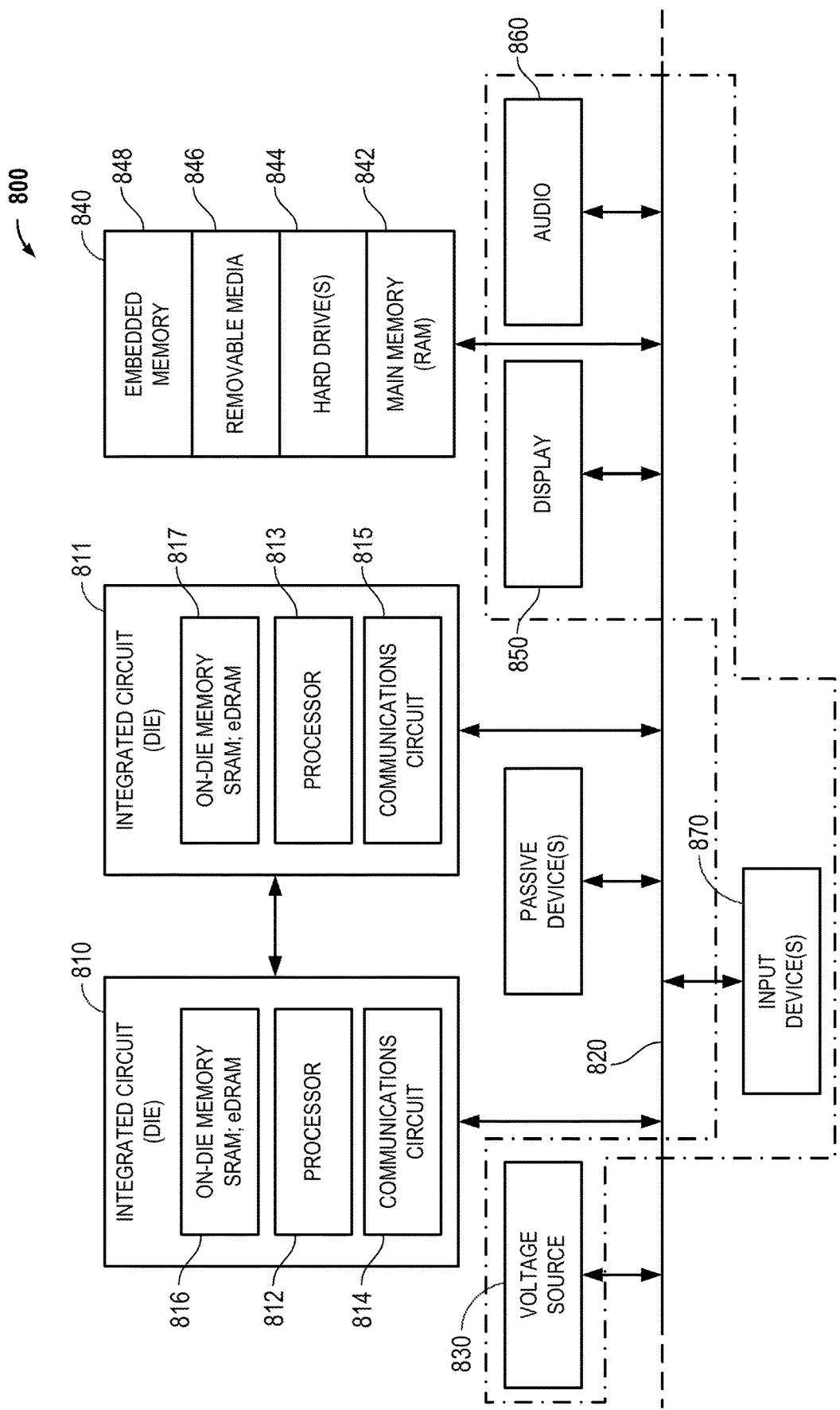
FIG. 8 is an illustration of a schematic block diagram of a computer system that utilizes a semiconductor package, according to an embodiment.

FIG. 8 illustrates a schematic of computer system 800 according to an embodiment. The computer system 800 (also referred to as an electronic system 800) can include a semiconductor package having protections against galvanic corrosion in accord with any of the embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

The electronic system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In one embodiment, the voltage source 830 supplies current to the integrated circuit 810 through the system bus 820.

The integrated circuit 810 is electrically coupled to the system bus 820 and includes any circuit, or combination of circuits according to an embodiment. For an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. For an embodiment, the processor 812 includes, or is coupled with, a semiconductor package having protections against galvanic corrosion in accord with any of the embodiments and their equivalents, as described in the foregoing specification. For an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. For an embodiment, the integrated circuit 810 includes on-die memory 816 such as static random-access memory (SRAM). For an embodiment, the integrated circuit 810 includes embedded on-die memory 816 such as embedded dynamic random-access memory (eDRAM). For one embodiment, the on-die memory 816 may be packaged with a process that includes one or more embodiments of protection against galvanic corrosion in accord with any of the embodiments and their equivalents, as described in the foregoing specification.

The integrated circuit 810 may be complemented with a subsequent integrated circuit 811. Useful embodiments include a dual processor 813 and a dual communications circuit 815 and dual on-die memory 817 such as SRAM. For an embodiment, the dual integrated circuit 810 includes embedded on-die memory 817 such as eDRAM.

For an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

For an embodiment, the electronic system 800 also includes a display device 850 and an audio output 860. For an embodiment, the electronic system 800 includes an input device such as a controller 870 that may be a keyboard, mouse, trackball, game controller, microphone, voice-recognition device, or any other input device that inputs information into the electronic system 800. For an embodiment, an input device 870 is a camera. For an embodiment, an input device 870 is a digital sound recorder. For an embodiment, an input device 870 is a camera and a digital sound recorder.

At least one of the integrated circuits 810 or 811 can be implemented in a number of different embodiments, including a semiconductor package having protection against galvanic corrosion as described herein, an electronic system, a computer system, one or more methods of fabricating an integrated circuit, and one or more methods of fabricating an electronic assembly that includes a semiconductor package having protection against galvanic corrosion, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed a semiconductor packages that includes an EMIB and protection against galvanic corrosion in accordance with any of the several disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments of galvanic protection that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a method of forming a semiconductor package, the method comprising: forming first openings in a build-up layer that is on an embedded interconnect bridge (EMIB) to uncover a top surface of the EMIB; plating a conductive material into the first openings to fill the first openings, a top surface of the conductive material in each of the first openings being co-planar with a top surface of the build-up layer; forming plated metal structures on the top surfaces of the conductive material and the build-up layer; encapsulating the plated metal structures and the uncovered top surface of the build-up layer in a solder resist composition; forming second openings in the solder resist composition, the second openings uncovering top surfaces of the plated metal structures and areas of the solder resist composition that are co-planar with the uncovered top surfaces of the plated metal structures; coating a surface finish onto the uncovered top surfaces of the plated metal structures within the second openings; building an interconnect structure on one of the coated and plated metal structures; building an electrical communications pathway from the interconnect structure to a contact region of a contact pad, where the contact region comprises one of the plated metal structures that is coated with the surface finish and is between a gap region formed from the uncovered area of the solder resist composition that is co planar with the top surfaces of the coated and plated metal structures; and electrically coupling the interconnect structure to the contact region via the pathway.

Additional embodiments include a method, wherein the first portion is exposed using a first lithography tool, wherein the second portion is exposed using a second lithography tool, and wherein the first and second lithography tools are different from each other.

Additional embodiments include a method, wherein the areas of the solder resist composition that are co-planar with the uncovered top surfaces of the plated metal structures are not coated with the surface finish.

Additional embodiments include a method, wherein the gap region is comprised of a dielectric material.

Additional embodiments include a method, further comprising desmearing the first openings prior to plating the conductive material into the first openings.

Additional embodiments include a method, further comprising: applying a dielectric layer on the top surfaces of the conductive material and the build-up layer; applying a seed layer on the dielectric layer; applying a resist layer on the seed layer; exposing portions of the resist layer; and removing the exposed portions of the resist layer to create a plurality of third openings, wherein the forming of the plated metal structures on the top surfaces of the conductive material and the build-up layer comprises plating another conductive metal into the plurality of third openings.

Additional embodiments include a method, wherein encapsulating the plated metal structures and the uncovered top surface of the build-up layer in the solder resist composition comprises: laminating the solder resist composition.

Additional embodiments include a method, wherein building an interconnect structure on one of the coated and plated metal structures comprises: applying a second resist layer on a top surface of the solder resist composition, wherein an opening is formed in the second resist layer over one of the coated and plated metal structures; forming another plated metal structure on a top surface of the one of the coated and plated metal structures; coating the formed plated metal structure with a surface finish; and stripping away the second resist layer.

Additional embodiments include a method, further comprising applying, prior to the application of the second resist layer, one or more of a dielectric layer, a seed layer, a metal layer, a protection layer, and a passivation layer on uncovered top surfaces of the solder resist composition and the surface finish.

Additional embodiments include a method, wherein the interconnect structure is not connected to any other part of the contact pad except the contact region.

Additional embodiments include a method, further comprising coupling a contact pad of a semiconductor die to the EMIB via the interconnect structure and the contact region of the contact pad.

Additional embodiments include a method, wherein a surface area of the contact region of the contact pad is substantially equal to a surface area of the interconnect structure.

Additional embodiments include a method, wherein a surface area of the contact region of the contact pad is no larger a surface area of the contact pad.

Embodiments described herein include a semiconductor package comprising: an embedded interconnect bridge (EMIB) within a cavity formed inside one or more first build-up layers; one or more second build-up layers on the EMIB; and multiple semiconductor dies on the one or more second build-up layers, wherein the multiple semiconductor dies are electrically coupled to the EMIB via a contact pad and an interconnect structure that are formed in the one or more second build-up layers and on the EMIB, wherein the contact pad comprises a contact region, a non-contact region, and a gap region that separates the contact region from the non-contact region.

Additional embodiments include a semiconductor package, wherein a surface area of the contact region is substantially equal to a surface area of the interconnect structure.

Additional embodiments include a semiconductor package, wherein the redistribution line is discoverable by an inspection tool.

Additional embodiments include a semiconductor package, wherein the contact region is electrically coupled to the interconnect structure.

Additional embodiments include a semiconductor package, wherein the non-contact region is not electrically coupled to the interconnect structure.

Additional embodiments include a semiconductor package, wherein each of the contact region and the non-contact region is formed from a conductive material and coated with a surface finish.

Additional embodiments include a semiconductor package, wherein the gap region is filled with a dielectric material. Additional embodiments include a semiconductor package, wherein each of the contact region and the non-contact region is formed from a conductive material and coated with a surface finish. Additional embodiments include a semiconductor package, wherein the surface finish is formed from one or more of nickel, palladium, and gold. Additional embodiments include a semiconductor package, wherein the conductive material comprises copper.

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A method of forming a cored or coreless semiconductor package, the method comprising:
   forming first openings in a build-up layer;
   plating a conductive material into the first openings to fill the first openings, a top surface of the conductive material in each of the first openings being co-planar with a top surface of the build-up layer;
   forming plated metal structures on the top surfaces of the conductive material and the build-up layer;
   encapsulating the plated metal structures and the uncovered top surfaces of the build-up layer in a solder resist composition;
   forming second openings in the solder resist composition, the second openings uncovering top surfaces of the plated metal structures and areas of the solder resist composition that are co-planar with the uncovered top surfaces of the plated metal structures;
   coating a surface finish onto the uncovered top surfaces of the plated metal structures within the second openings to form coated and plated metal structures;
   building an interconnect structure on one of the coated and plated metal structures;
   building an electrical communications pathway from the interconnect structure to a contact region of a contact pad, where the contact region comprises one of the plated metal structures that is coated with the surface finish and is between a gap region formed from an uncovered area of the solder resist composition that is co-planar with the top surfaces of the coated and plated metal structures; and
   electrically coupling the interconnect structure to the contact region via the electrical communications pathway.

2. The method of claim 1, wherein the areas of the solder resist composition that are co-planar with the uncovered top surfaces of the plated metal structures are not coated with the surface finish.

3. The method of claim 1, wherein the gap region is comprised of a dielectric material.

4. The method of claim 1, further comprising desmearing the first openings prior to plating the conductive material into the first openings.

5. The method of claim 1, further comprising:
   applying a dielectric layer on the top surfaces of the conductive material and the build-up layer;
   applying a seed layer on the dielectric layer;
   applying a resist layer on the seed layer; exposing portions of the resist layer; and
   removing the exposed portions of the resist layer to create a plurality of third openings, wherein the forming of the plated metal structures on the top surfaces of the conductive material and the build-up layer comprises plating another conductive metal into the plurality of third openings.

6. The method of claim 1, wherein encapsulating the plated metal structures and the uncovered top surface of the build-up layer in the solder resist composition comprises: laminating the solder resist composition.

7. The method of claim 1, wherein building an interconnect structure on one of the coated and plated metal structures comprises:
   applying a second resist layer on a top surface of the solder resist composition, wherein an opening is formed in the second resist layer over one of the coated and plated metal structures;
   forming another plated metal structure on a top surface of the one of the coated and plated metal structures;
   coating the formed plated metal structure with a surface finish; and
   stripping away the second resist layer.

8. The method of claim 7, further comprising applying, prior to application of the second resist layer, one or more of a dielectric layer, a seed layer, a metal layer, a protection layer, and a passivation layer on uncovered top surfaces of the solder resist composition and the surface finish.

9. The method of claim 1, wherein the interconnect structure is not connected to any other part of the contact pad except the contact region.

10. The method of claim 1, further comprising coupling a contact pad of a first semiconductor component to a second semiconductor component via the interconnect structure and the contact region of the contact pad.

11. The method of claim 1, wherein a surface area of the contact region of the contact pad is substantially equal to a surface area of the interconnect structure.

12. The method of claim 1, wherein a surface area of the contact region of the contact pad is no larger a surface area of the contact pad.

13. A cored or coreless semiconductor package comprising:
   one or more build-up layers; and
   one or more first semiconductor components and one or more second semiconductor components on the one or more build-up layers, wherein the one or more first semiconductor components are electrically coupled to the one or more second semiconductor components via a contact pad and an interconnect structure that are formed in the one or more build-up layers, wherein the contact pad comprises a contact region, a non-contact region, and a gap region that separates the contact region from the non-contact region.

14. The package of claim 13, wherein a surface area of the contact region is substantially equal to a surface area of the interconnect structure.

15. The package of claim 13, wherein the contact region is electrically coupled to the interconnect structure.

16. The package of claim 15, wherein the non-contact region is not electrically coupled to the interconnect structure.

17. The package of claim 13, wherein each of the contact region and the non-contact region is formed from a conductive material and coated with a surface finish.

18. The package of claim 17, wherein the gap region is filled with a dielectric material.

19. The package of claim 17, wherein the surface finish is formed from one or more of a metal and a metal alloy.

20. The package of claim 17, wherein the conductive material comprises one or more of a metal and a metal alloy.

* * * * *